US008116465B2

(12) United States Patent
Asada

(10) Patent No.: US 8,116,465 B2

(45) Date of Patent: Feb. 14, 2012

(54) MEASURING APPARATUS AND METHOD, AND RECORDING MEDIUM

(75) Inventor: Kohei Asada, Kanagawa (JP)

(73) Assignee: Sony Corporation (JP)

( * ) Notice: Subject to any disclaimer, the term of this patent is extended or adjusted under 35 U.S.C. 154(b) by 2078 days.

(21) Appl. No.: 11/102,431

(22) Filed: Apr. 7, 2005

(65) Prior Publication Data

US 2005/0244012 A1 Nov. 3, 2005

(30) Foreign Application Priority Data

Apr. 28, 2004 (JP) ............................... P2004-133671

(51) Int. Cl.

| | |
|---|---|
| ***H04R 29/00*** | (2006.01) |
| ***H04R 5/00*** | (2006.01) |
| ***H03G 5/00*** | (2006.01) |

(52) U.S. Cl. .................. 381/58; 381/56; 381/98; 381/1; 381/17

(58) Field of Classification Search .................... 381/74, 381/120, 77, 56, 98, 58, 1, 17–19; 310/313 B; 702/103

See application file for complete search history.

(56) References Cited

U.S. PATENT DOCUMENTS

| | | | | |
|---|---|---|---|---|
| 4,185,218 | A * | 1/1980 | Bagdasarian et al. | 310/313 B |
| 4,306,113 | A * | 12/1981 | Morton | 381/58 |
| 5,109,415 | A * | 4/1992 | Ishida | 381/1 |
| 5,572,443 | A * | 11/1996 | Emoto et al. | 702/103 |
| 6,760,451 | B1 * | 7/2004 | Craven et al. | 381/98 |

FOREIGN PATENT DOCUMENTS

JP 2000 261900 A 9/2000

* cited by examiner

*Primary Examiner* — Devona Faulk

(74) *Attorney, Agent, or Firm* — Lerner, David, Littenberg, Krumholz & Mentlik, LLP

(57) ABSTRACT

A sound measuring apparatus includes an impulse response obtaining section obtaining an impulse response, a positive transform section performing a positive transform on the impulse response obtained by the impulse response obtaining section, a filter low-pass filtering the response waveform on which the positive transform was performed by the positive transform section, a frequency characteristic obtaining section obtaining a frequency characteristic of the impulse response obtained by the impulse response obtaining section, a filter characteristic setting section setting a filter characteristic of the low-pass filter so as to be variable depending upon the frequency characteristic obtained by the frequency characteristic obtaining section, and a measurement result obtaining section obtaining a measurement result about a predetermined measurement item, based on the waveform obtained by the low-pass filter.

9 Claims, 13 Drawing Sheets

MEASURING APPARATUS AND METHOD, AND RECORDING MEDIUM

CROSS REFERENCES TO RELATED APPLICATIONS

The present invention contains subject matter related to Japanese Patent Application JP 2004-133671 filed in the Japanese Patent Office on Apr. 28, 2004, the entire contents of which are incorporated herein by reference.

BACKGROUND OF THE INVENTION

1. Field of the Invention

The present invention relates to an acoustic measuring apparatus and method, and to a program executed by the apparatus.

2. Description of the Related Art

For example, when audio signals reproduced by a multi-channel audio system are output from a plurality of loudspeakers and are listened to by a listener, a sound field (or sound radiation) perceived by the listener differs as the sound balance or the sound quality changes depending upon the listening environment, e.g., the structure of the listening room, the listening position of the listener with respect to the loudspeakers, etc. Under some conditions of the listening environment, the listener at the listening position may not perceive a desired sound field.

This problem is particularly critical in, for example, a vehicle cabin. In a vehicle cabin, a listener mostly sits on a seat, and the distance between the listener and individual loudspeakers varies. The difference in the arrival time of sounds from the loudspeakers causes a largely unbalanced sound field. Since the vehicle cabin is relatively small and substantially closed, a complex synthesized sound including reflection, etc., reaches the listener, and causes an unbalanced sound field. Due to the limitation of space in which the loudspeakers are installed, it is difficult to place the loudspeakers so that sound can reach the listener's ear directly from the loudspeakers. Variations in the sound quality affect the sound field.

An acoustic correction approach is common to allow the listener to listen to sound in a desired sound field similar to the actual sound source in a listening environment using an audio system. In the acoustic correction approach, for example, delay times of audio signals to be output from the loudspeakers are adjusted to correct for the difference in the arrival time of sounds at the listener's ear.

For more efficient acoustic correction, for example, it is desirable to automatically adjust the delay times using an acoustic correction apparatus rather than using only the auditory sensation of a user (or a listener).

Specifically, the acoustic correction apparatus first measures the acoustic characteristic of the listening environment, and sets acoustic-correction signal processing parameters of the sound output section in the audio system based on the measured acoustic characteristic. An audio signal processed according to these parameters is output from each loudspeaker, thus allowing the user to listen to the sound source in a desired sound field that has been corrected in accordance with the listening environment without adjusting the sound field.

In one known technique for measuring an acoustic characteristic and performing acoustic correction based on the measured acoustic characteristic, first, a microphone is placed at a listening position corresponding to the position of the listener's ear in the listening space. An acoustic correction apparatus outputs measurement sound from each loudspeaker. The output measurement signal is collected by the microphone to produce an audio signal, and the audio signal is analog-to-digital (A/D) converted. The acoustic correction apparatus obtains, for example, distance information between the individual loudspeakers and the listening position (i.e., the position of the microphone or the position at which sound is collected) based on the characteristic of the A/D converted measurement sound. Based on the distance information, sound-arrival time information in space from the individual loudspeakers to the listening position is obtained. The acoustic correction apparatus sets the delay time of a corresponding channel of audio signal to each loudspeaker using the sound-arrival time information about this loudspeaker so that the sounds output from the individual loudspeakers reach the listening position at the same time. Such correction is called time alignment.

Generally, a sine-wave signal or a burst signal is used as a measurement sound output from each loudspeaker to measure the distance between the loudspeaker and the microphone.

Japanese Unexamined Patent Application Publication No. 2000-261900 discloses an acoustic correction apparatus.

SUMMARY OF THE INVENTION

Due to its inherent nature, a sine-wave signal or a burst signal has a limited frequency range. A group delay characteristic in which the frequency range of the sine-wave signal or the burst signal used as measurement sound largely varies causes a phase change in addition to a spatial delay, and makes it more difficult to determine the distance with accuracy.

In another technique, distance information is obtained based on an impulse response, for example, by detecting the rise time of the waveform of the impulse response. An impulse signal is known as a signal including harmonics having the same intensity as that of the fundamental. Therefore, this technique overcomes the problem caused by a narrow frequency range, described above.

Since an impulse response waveform used for, for example, measurement of the distance has low resistance particularly to high-frequency noise, the rising waveform of the impulse response is liable to fluctuate. Due to the nature of the impulse response waveform, actually, the rise time of the impulse response cannot be correctly detected, resulting in large detection error. Practically, it is difficult to determine the distance from the impulse response waveform itself.

According to an embodiment of the present invention, there is provided a measuring apparatus including the following elements. Impulse response obtaining means obtains an impulse response. Positive transform means performs positive transform on the impulse response obtained by the impulse response obtaining means. Low-pass filter means low-pass filters the response waveform on which positive transform is performed by the positive transform means. Frequency characteristic obtaining means obtains a frequency characteristic of the impulse response obtained by the impulse response obtaining means. Filter characteristic setting means sets a filter characteristic of the low-pass filter means so as to be variable depending upon the frequency characteristic obtained by the frequency characteristic obtaining means. Measurement result obtaining means obtains a measurement result about a predetermined measurement item based on the waveform obtained by the low-pass filter means.

According to another embodiment of the present invention, there is provided a measuring method comprising the steps of obtaining an impulse response, performing positive transform on the impulse response obtained in the step of obtaining an impulse response, low-pass filtering the response waveform on which positive transform is performed, obtaining a frequency characteristic of the impulse response obtained in the step of obtaining an impulse response, setting a filter characteristic in the step of low-pass filtering so as to be variable depending upon the frequency characteristic obtained in the step of obtaining a frequency characteristic, and obtaining a measurement result about a predetermined measurement item based on the waveform obtained in the step of low-pass filtering.

According to another embodiment of the present invention, there is provided a recording medium recording a program. The program causes a measuring apparatus to execute the steps of obtaining an impulse response, performing positive transform on the impulse response obtained in the step of obtaining an impulse response, low-pass filtering the response waveform on which positive transform is performed, obtaining a frequency characteristic of the impulse response obtained in the step of obtaining an impulse response, setting a filter characteristic in the step of low-pass filtering so as to be variable depending upon the frequency characteristic obtained in the step of obtaining a frequency characteristic, and obtaining a measurement result about a predetermined measurement item based on the waveform obtained in the step of low-pass filtering.

Accordingly, acoustic measurement is performed using an impulse response technique. A given impulse response is subjected to at least to a positive transform process and a filtering process using a low-pass filter after the positive transform process. Only the positive amplitude of the original waveform of the impulse response is obtained by performing positive transform. Thus, high-accuracy simple measurement can be realized using the positive amplitude. The waveform of the impulse response that has been filtered by the low-pass filter improves the resistance to, particularly, high-frequency noise because the high-frequency components have been removed according to the filtering characteristic. It is therefore expected that the waveform of the impulse response that has been subjected to positive transform and filtering using a low-pass filter allows higher-accuracy measurement than the original waveform of the impulse response.

Moreover, the filter characteristic of the low-pass filter is variable depending upon the frequency response (or the frequency band characteristic) of the original waveform of the impulse response. Thus, the output waveform of the low-pass filter allows high-accuracy measurement with higher noise resistance adaptive to the frequency band characteristic of the original waveform of the impulse response.

Therefore, a higher-accuracy higher-reliability acoustic measurement using an impulse response can be realized in practical use.

DESCRIPTION OF THE PREFERRED EMBODIMENTS

Embodiments of the present invention will now be described.

A measuring apparatus according to an embodiment of the present invention will be described in the context of an acoustic correction apparatus for correcting a sound field reproduced by a multi-channel audio system. The measuring apparatus according to the present embodiment of measures an acoustic characteristic of a listening environment using the audio system to perform acoustic correction.

The acoustic correction apparatus according to the present embodiment is not originally incorporated in an audio system, but is attachable to the audio system. The acoustic correction apparatus is connectable to any audio system complying with a certain specification.

Figure 1:
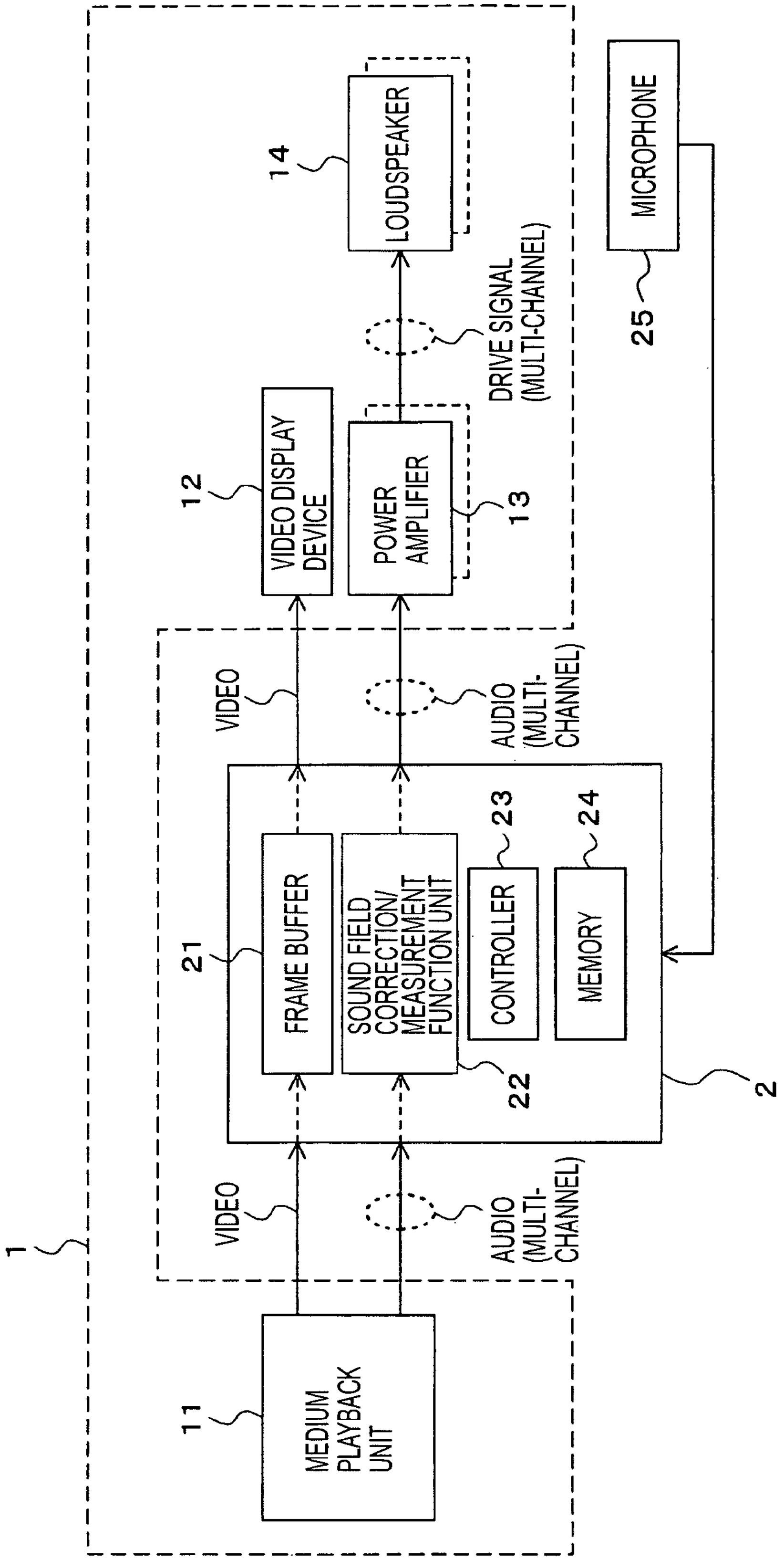
FIG. 1 is a block diagram of a system including an acoustic correction apparatus according to an embodiment of the present invention and an audio and video (AV) system.

FIG. 1 shows the structure of a system including an acoustic correction apparatus 2 according to an embodiment of the present invention and an audio and video (AV) system 1 connected to the acoustic correction apparatus 2. As described above, the acoustic correction apparatus 2 is an attachable kit compatible with a certain range of general-purpose devices. In the example shown in FIG. 1, the AV system 1 connectable to the acoustic correction apparatus 2 is capable of both audio and video reproduction.

The AV system 1 includes a medium playback unit 11, a video display device 12, a power amplifier 13, and a loudspeaker 14.

The medium playback unit 11 plays back a medium recording data, e.g., video and audio content, to reproduce and output video and audio signals. The medium playback unit 11 outputs digital video and audio signals.

The medium playback unit 11 may play back any type and format of medium, and plays back a digital versatile disc (DVD), by way of example. Specifically, the medium playback unit 11 reads video and audio content data recorded on a loaded DVD, and obtains, for example, video data and audio data to be simultaneously reproduced and output. In the current DVD format, video and audio data is compressed and encoded according to a compression method, such as MPEG-2 (moving picture expert group 2). The medium playback unit 11 decodes the compressed and encoded video and audio data, and outputs the decoded video and audio signals so as to provide synchronized reproduction of these signals.

The medium playback unit 11 may be a multi-media player capable of playing back DVDs and other media such as audio CDs. The medium playback unit 11 may also be a television tuner for receiving and demodulating television broadcasts and outputting video and audio signals. The medium playback unit 11 may also have a television tuner function and a packaged-media playback function. The medium playback unit 11 may also be a storage device, such as a hard disk, and various types of content stored in this storage device may be reproduced and output.

When the medium playback unit 11 is compatible with multi-channel audio, audio signals are reproduced and output from the medium playback unit 11 via a plurality of signal lines corresponding to the individual audio channels. For example, the medium playback unit 11 is compatible with 7.1-channel surround systems, i.e., a center channel (C), a front left channel (L), a front right channel (R), a left surround channel (Ls), a right surround channel (Rs), a left back surround channel (Bsl), a right back surround channel (Bsr), and a subwoofer channel (SW). Audio signals are output via eight lines corresponding to the individual channels.

In view of the AV system 1, a video signal output from the medium playback unit 11 is input to the video display device 12, and an audio signal is input to the power amplifier 13.

The video display device 12 displays video based on the input video signal. In practice, the video display device 12 may be any display device, such as a cathode ray tube (CRT), a liquid crystal display (LCD), or a plasma display panel (PDP).

The power amplifier 13 amplifies the input audio signal, and outputs a drive signal for driving the loudspeaker 14. The power amplifier 13 includes a plurality of power amplification circuits corresponding to the individual audio channels with which the AV system 1 is compatible. Each power amplification circuit amplifies each channel of audio signal, and outputs a drive signal to the loudspeaker 14 corresponding to this channel. Thus, the AV system 1 includes a plurality of loudspeakers 14 corresponding to the audio channels with which the AV system 1 is compatible. For example, when the AV system 1 is compatible with a 7.1-channel surround system, the power amplifier 13 includes eight power amplification circuits. In this case, eight loudspeakers 14 corresponding to the individual channels are placed at desired positions in the listening environment.

The drive signal that is obtained by amplifying each channel of audio signal is supplied from the power amplifier 13 to the loudspeaker 14 corresponding to the corresponding channel to output the corresponding channel of sound into space from the corresponding loudspeaker 14. Thus, the audio content is reproduced so that a multi-channel sound field is produced. The sound reproduced and output from the loudspeaker 14 is synchronized (or achieves lip-sync) with video displayed on the video display device 12 based on the video signal.

For example, the AV system 1 may be formed of a component AV system in which the medium playback unit 11, the video display device 12, the power amplifier 13, and the loudspeaker 14 are separate components, or may have a unit-type apparatus configuration in which at least two of these components are integrated into one unit.

When the acoustic correction apparatus 2 is connected in an attachable manner to the AV system 1, the audio signal output from the medium playback unit 11 is input to the acoustic correction apparatus 2.

The acoustic correction apparatus 2 compatible with up to 7.1 surround channels has eight audio signal input terminals corresponding to the individual channels.

For example, when the AV system 1 is compatible with right and left stereo channels, the AV system 1 and the acoustic correction apparatus 2 are connected so that right-channel and left-channel audio signals output from the medium playback unit 11 are input to the front-right-channel (R) and front-left-channel (L) input terminals in the eight audio signal input terminals of the acoustic correction apparatus 2, respectively.

The acoustic correction apparatus 2 also has audio signal output terminals capable of outputting up to 7.1 surround channels of audio signals. The audio signal output terminals of the acoustic correction apparatus 2 are connected to corresponding channels of audio signal input terminals of the power amplifier 13.

As described above, the medium playback unit. 11 decodes audio information read from a medium if the read audio data is compressed and encoded data, and outputs the decoded data as a digital audio signal. The acoustic correction apparatus 2 processes an audio signal that is demodulated if the audio signal has been compressed and encoded, and therefore does not need to include an encoder or a decoder for processing compressed and encoded audio signals.

The measurement sound to be output from the acoustic correction apparatus 2 to the power amplifier 13 may be formed of a decoded signal. Therefore, it is not necessary for an encoder or a decoder to reproduce the measurement sound.

The acoustic correction apparatus 2 may also manipulate video inputs and outputs. In this case, a video signal system is connected so that a video signal is input from the medium playback unit 11 and is output to the video display device 12.

Similarly to audio signal processing, the acoustic correction apparatus 2 processes a digital decoded video signal if it is compressed and encoded video data.

The acoustic correction apparatus 2 manipulating video and audio inputs includes a frame buffer 21, a sound field correction and measurement function unit 22, a controller 23, and a memory 24.

The sound field correction and measurement function unit 22 has two functions: a measurement function and a sound field correction function. The measurement function is used for acoustic measurement of a listening environment to set a sound field control parameter value necessary for correcting a sound field. When the measurement function is executed, a measurement sound signal is output to the power amplifier 13 so that measurement sound is output via a certain audio channel, if necessary.

The sound field correction and measurement function unit 22 further performs signal processing on each channel of audio signal input from the medium playback unit 11 according to the sound field control parameter value set based on a result of measurement performed using the measurement function, and outputs a resulting signal to the power amplifier 13. A sound field produced by the sound output from the loudspeaker 14 has been corrected to the optimum sound field at the listening position.

In the signal processing for sound field control described above, the audio signal output from the medium playback unit 11 passes through a digital signal processor (DSP) in the acoustic correction apparatus 2. The audio signal passing through the DSP causes a time lag with respect to the video signal output from the medium playback unit 11 during reproduction. The frame buffer 2 overcomes this time lag problem and achieves lip-sync. For example, the controller 23 controls the frame buffer 21 to write the video signal input from the medium playback unit 11 in units of frames to temporarily hold the video signal before outputting it to the video display device 12. Thus, the acoustic correction apparatus 2 provides synchronized reproduction of the video and audio signals with no time lag.

The controller 23 is formed of a microcomputer including, for example, a central processing unit (CPU), a read-only memory (ROM), and a random access memory (RAM). The controller 23 not only performs write/read control of the frame buffer 21 but also performs control and processing on the function units in the acoustic correction apparatus 2.

A microphone 25 to be attached to the acoustic correction apparatus 2 is connected to the acoustic correction apparatus 2 to collect the measurement sound output from the loudspeaker 14 during measurement performed by the acoustic correction apparatus 2.

Figure 2:
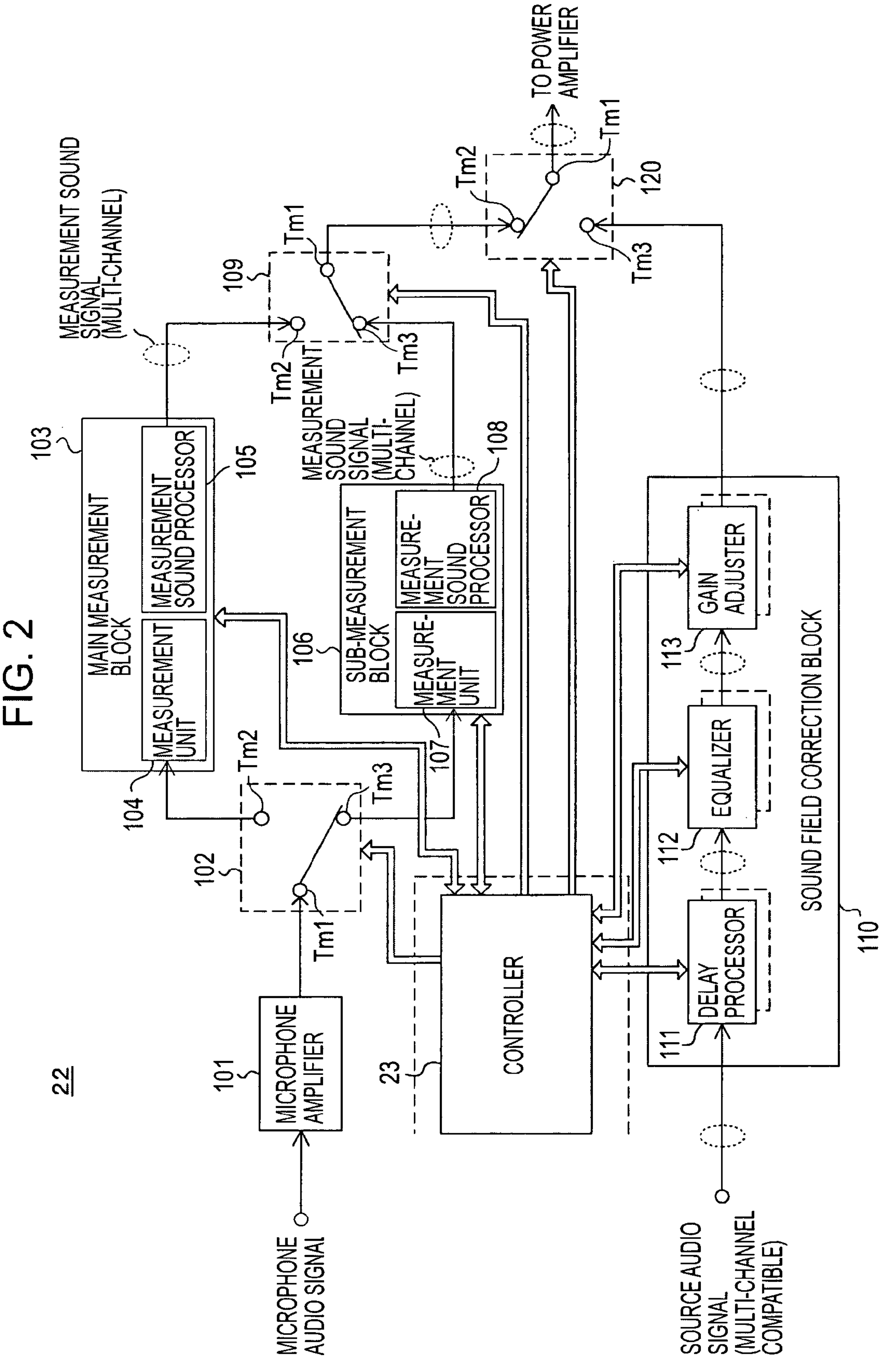
FIG. 2 is a block diagram of the acoustic correction apparatus.

FIG. 2 shows the internal structure of the sound field correction and measurement function unit 22. As shown in FIG. 2, the sound field correction and measurement function unit 22 includes a microphone amplifier 101, a main-measurement block 103, a pre-measurement block 106, and a sound field correction block 110. The sound field correction block 110 performs a sound field correction process; whereas, the microphone amplifier 101, the main-measurement block 103, and the pre-measurement block 106 perform a measurement process. Based on a measurement result, parameter values necessary for sound field correction to be performed by the sound field correction block 110 are changed.

Switches 102 and 109 are operable to switch the measurement mode between main-measurement and pre-measurement. A switch 120 is operable to switch between the measurement mode and the sound field correction mode. Each of the switches 102, 109, and 120 is used to connect a terminal Tm1 to a terminal Tm2 or Tm3. The switching operations are controlled by the controller 23.

As described above, the acoustic correction apparatus 2 according to the present embodiment is an attachable kit with respect to the AV system 1. According to the present embodiment, the audio system connected to the acoustic correction apparatus 2 is not fixed, and therefore the multi-channel scheme with which each audio system is compatible is not specified.

The acoustic correction apparatus 2 according to the present invention has a pre-measurement mode prior to a main-measurement mode. In the pre-measurement mode, the channel configuration (or loudspeaker configuration) of an audio system actually connected to the acoustic correction apparatus 2 is determined. Depending upon the channel configuration determined in the pre-measurement mode, the level of the signal to be output from each channel of loudspeaker is determined in the main-measurement mode. Based on a measurement result obtained in the main-measurement mode, predetermined signal processing parameters are modified to correct a sound field.

The sound field correction and measurement function unit 22 shown in FIG. 2 will be described in the context of the operation in the pre-measurement mode.

In the pre-measurement mode, the controller 23 causes the switch 120 to connect the terminal Tm1 to the terminal Tm2, and causes the switches 102 and 109 to connect the terminal Tm1 to the terminal Tm3. Thus, a signal path for the pre-measurement mode is formed in the sound field correction and measurement function unit 22.

As shown in FIG. 2, the pre-measurement block 106 includes a measurement unit 107 and a measurement sound processor 108.

The measurement sound processor 108 generates an audio signal for producing measurement sound for pre-measurement, and outputs the audio signal as a measurement sound signal.

For convenience of illustration, FIG. 2 shows only one signal output line from the measurement sound processor 108. Actually, a corresponding number of measurement sound signal output lines to eight channels compatible with 7.1-channel surround systems may be provided.

In FIG. 2, the measurement sound signal output from the measurement sound processor 108 in the pre-measurement block 106 is input to the power amplifier 13 shown in FIG. 1 via the switch 109 (from the terminal Tm3 to the terminal Tm1) and the switch 120 (from the terminal Tm2 to the terminal Tm1). The power amplifier 13 amplifies the input measurement sound signal, and outputs the amplified signal from the loudspeaker 14.

As can be understood from the foregoing description, when the measurement sound processor 108 outputs a plurality of channels measurement sound (phoneme) signals in parallel, the power amplifier 13 amplifies these channels of audio signals, and outputs the amplified audio signals from the corresponding channels of loudspeakers 14.

Therefore, the measurement sound signal (or signals) can be output as real sound into the space from the loudspeaker (or loudspeakers) 14.

In the main-measurement and pre-measurement modes, the microphone 25 is connected to the acoustic correction apparatus 2, as shown in FIG. 1, to collect measurement sound. The audio signal from the microphone 25 connected to the acoustic correction apparatus 2 is input to the microphone amplifier 101 in the sound field correction and measurement function unit 22, as shown in FIG. 2.

The microphone 25 is placed so as to collect sound at a listening position at which the optimum corrected sound field is to be produced in the listening environment. For example, if the system shown in FIG. 1 is an in-vehicle device and a user on the driving seat desires to obtain a desired sound field, the microphone 25 is placed so as to collect sound at the position of the user's ear when the user sits on the driving seat.

As described above, a measurement sound signal is output from the measurement sound processor 108 in the pre-measurement mode and the measurement sound is output from the loudspeaker 14, and the microphone 25 collects ambient environmental sound including the measurement sound. The audio signal of the collected sound is amplified by the microphone amplifier 101, and is then input to the measurement unit 107 in the pre-measurement block 106 via the terminals Tm1 and Tm3 of the switch 102.

The measurement unit 107 performs A/D conversion on the input audio signal to obtain a response signal, and further performs frequency analysis on the response signal by, for example, fast Fourier transform (FFT). The resulting signal is transmitted to, for example, the controller 23, and the controller 23 obtains results of certain measurement items including the channel configuration (or the number of loudspeakers 14) and the level of measurement sound for main measurement based on the frequency analysis result.

In the main-measurement mode, the switch 120 is still caused to connect the terminal Tm1 to the terminal Tm2 to realize the measurement mode, and the controller 23 causes the switches 102 and 109 to connect the terminal Tm1 to the terminal Tm2. Thus, a signal path for the main-measurement mode is formed in the sound field correction and measurement function unit 22.

In the main-measurement mode, the main-measurement block 103 is enabled instead of the pre-measurement block 106. The main-measurement block 103 also includes a measurement unit 104 and a measurement sound processor 105. In the main-measurement mode, the measurement sound processor 105 generates a signal waveform to be used for main measurement, and outputs it as measurement sound.

The level of the measurement sound to be output from each channel of loudspeaker 14 is determined based on a measurement result in the pre-measurement mode. The loudspeaker configuration (or channel configuration) is also determined in the pre-measurement mode. This prevents an undetected channel of loudspeaker in the AV system from outputting measurement sound. Thus, the processing load on the measurement sound processor 105 can efficiently be reduced. The controller 23 controls the measurement sound processor 105 according to results of pre-measurement to determine the level of the measurement sound and to determine which channel of loudspeaker outputs the measurement.

In this way, the measurement sound processor 105 in the main-measurement block 103 outputs a measurement sound signal. Like in the pre-measurement mode, the microphone 25 collects ambient environmental sound including the measurement sound, and the collected sound is input to the measurement unit 104 from the microphone amplifier 101 via the terminals Tm1 and Tm2 of the switch 102.

The measurement unit 104 samples the input audio signal at a predetermined timing corresponding to the measurement sound output, and obtains a response signal. The response signal is then subjected to the processing described below and frequency analysis to obtain a main-measurement result about predetermined measurement items. The measurement unit 104 further determines parameter values for correcting a sound field based on the main-measurement result.

The measurement unit 104 in the main-measurement block 103 and the measurement unit 107 in the pre-measurement block 106 have common functions, e.g., FFT-based frequency analysis, and the main-measurement process and the pre-measurement process are not simultaneously executed in parallel. The measurement units 104 and 107 can therefore be shared in the main-measurement and pre-measurement processes.

In the sound field correction mode, the switch 120 is caused to connect the terminal Tm1 to the terminal Tm3. The switches 102 and 109 are used to switch the measurement mode between the main-measurement mode and the pre-measurement mode, and the terminal switching state of the switches 102 and 109 is not set.

In the sound field correction mode, a source audio signal is input to the sound field correction block 110. The source audio signal is an audio signal reproduced and output from the medium playback unit 11, and, as described above, a plurality of multi-channel audio signals up to eight channels may be input. The sound field correction block 110 includes a delay processor 111, an equalizer 112, and a gain adjuster 113, and each of these components can independently process audio signals up to eight channels (compatible with 7.1-channel surround systems).

In the sound field correction block 110, the delay processor 111 delays and outputs individual channels of input audio signals by different delay times. The delay processor 111 compensates for an unbalanced sound field caused by the difference in the arrival time of sounds from the loudspeakers at the listening position depending upon the difference in distance from the loudspeakers to the listening position.

The equalizer 112 arbitrarily determines equalizer characteristics specific to the individual channels of input audio signals, and outputs the equalizer characteristics. The equalizer 112 also compensates for the sound quality that varies depending upon the relationship between the position of each loudspeaker and the listening position, the state of an obstacle between each loudspeaker and the listening position, or the reproduced sound characteristic of each loudspeaker.

The gain adjuster 113 independently determines gains of the individual channels of input audio signals, and outputs the gains. The gain adjuster 113 also compensates for the volume of sound that varies in channels depending upon the positional relationship between each loudspeaker and the listening position, the state of an obstacle between each loudspeaker and the listening position, or the distance between each loudspeaker and the listening position.

The sound field correction block 110 having the signal processing functions described above is configured as, for example, an audio DSP.

As a result of the main measurement, the controller 23 obtains information including the time difference of sounds reaching the listening position from the individual audio channels (i.e., the distance between each loudspeaker and the listening position), a change in the sound quality when each audio channel of sound reaches the listening position, and variations in the sound level.

Based on a parameter for sound field correction, e.g., the information about the time difference of sound reaching the listening position from the individual audio channels, the controller 23 sets a delay time of the delay processor 111 with respect to each audio channel in order to compensate for the time difference. That is, sound field correction, called time alignment, is performed.

Based on the information about a change in the sound quality when each audio channel of sound reaches the listening position, the controller 23 sets an equalizer characteristic of the equalizer 112 with respect to each audio channel in order to compensate for the change in the sound quality.

Based on the information about variations in the sound level when each audio channel of sound reaches the listening position, the controller 23 sets a gain of the gain adjuster 113 with respect to each audio channel in order to compensate for the variations.

The source audio signal input to the sound field correction block 110 is processed by the delay processor 111, the equalizer 112, and the gain adjuster 113 whose parameters are set in the manner described above. The resulting signal is amplified by the power amplifier 13, and is then output as real sound from the loudspeaker 4. The sound field formed of the output sound is better than uncorrected one at a listening position.

The mechanism and operation of the main-measurement block 103 for measurement of the distance from each loudspeaker in the AV system 1 to the listening position will be described.

The distance from each actual loudspeaker in the AV system 1 to the listening position corresponds to a period of time from when each audio channel of sound is output from each loudspeaker until the sound reaches the listening position. Using the distance information from each loudspeaker to the listening position, the delay processor 111 in the sound field correction block 110 performs time alignment.

In a procedure for measuring the distance from each loudspeaker to the listening position, first, one of a plurality of loudspeakers in the AV system 1 is selected, and measurement sound for measurement of the distance is output from the selected loudspeaker. The measurement sound is formed of a time stretched pulse (TSP) signal having a predetermined frequency band characteristic. The TSP signal is collected by the microphone 25 located at the listening position, and the collected sound signal is input to the measurement unit 104 in the main-measurement block 101 from the microphone amplifier 101 via the switch 102 (the terminal Tm1 to the terminal Tm2). The measurement unit 104 obtains sampling data by sampling the input audio signal waveform in units of a predetermined number of samples. For example, the sampling data is divided on the frequency axis by the TSP signal to produce an impulse response.

The impulse response is subjected to signal processing and measurement computation described below by the measurement unit 104 to obtain distance information between the loudspeaker from which the sound has been output and the listening position (or the microphone 25) (i.e., the loudspeaker-microphone distance) as a measurement result.

The operation to measure the loudspeaker-microphone distance based on an impulse response to the impulse output from each loudspeaker and collected by the microphone 25 is performed with respect to the remaining loudspeakers. Finally, the loudspeaker-microphone distance information between all audio channels of loudspeakers in the AV system 1 and the microphone 25 (or the listening position) can be obtained.

Figure 3:
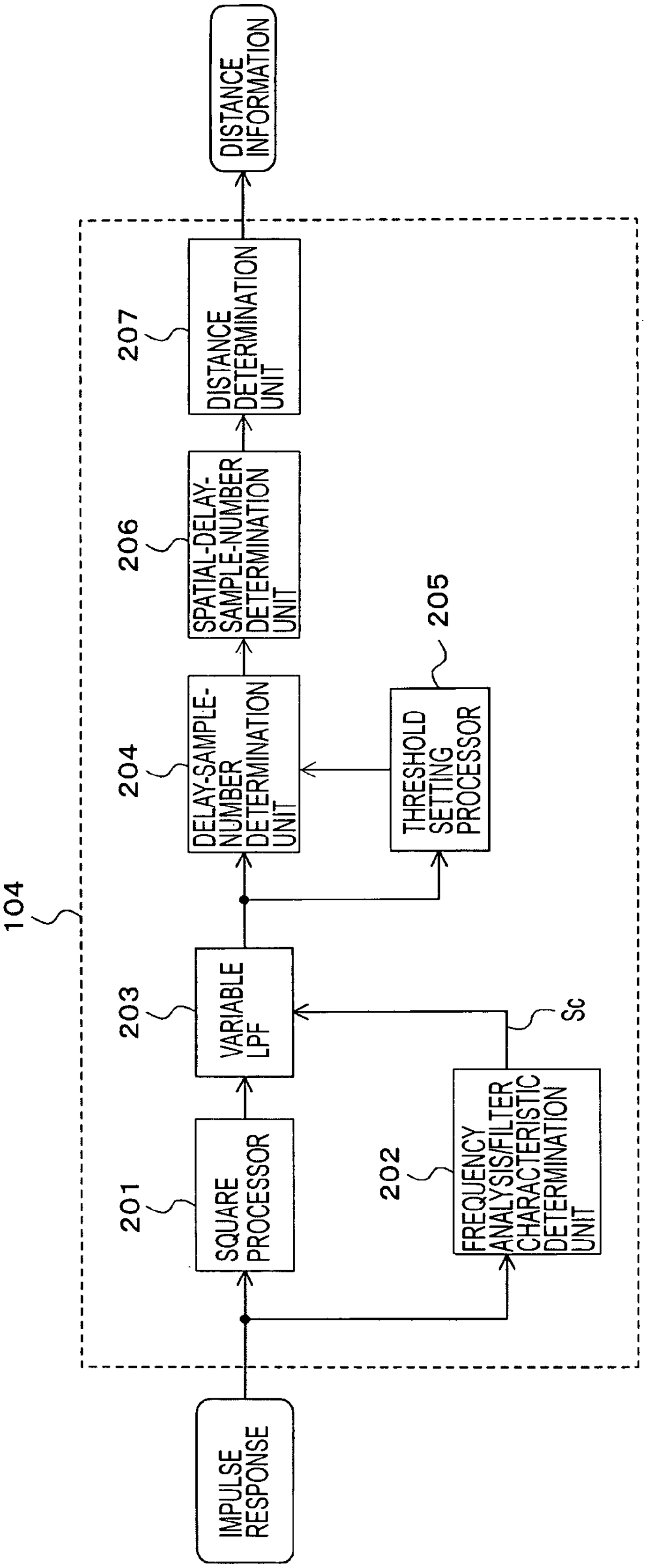
FIG. 3 is a block diagram of a measurement unit in the acoustic correction apparatus for measuring the spatial loudspeaker-microphone distance.

FIG. 3 shows functional blocks in a processing mechanism of the measurement unit 104 in the main-measurement block 103 for measuring the loudspeaker-microphone (or listening position) distance based on the impulse response. A procedure for measuring the distance performed by the mechanism shown in FIG. 3 will first be described with reference to FIGS. 4 to 6C.

Figure 4:
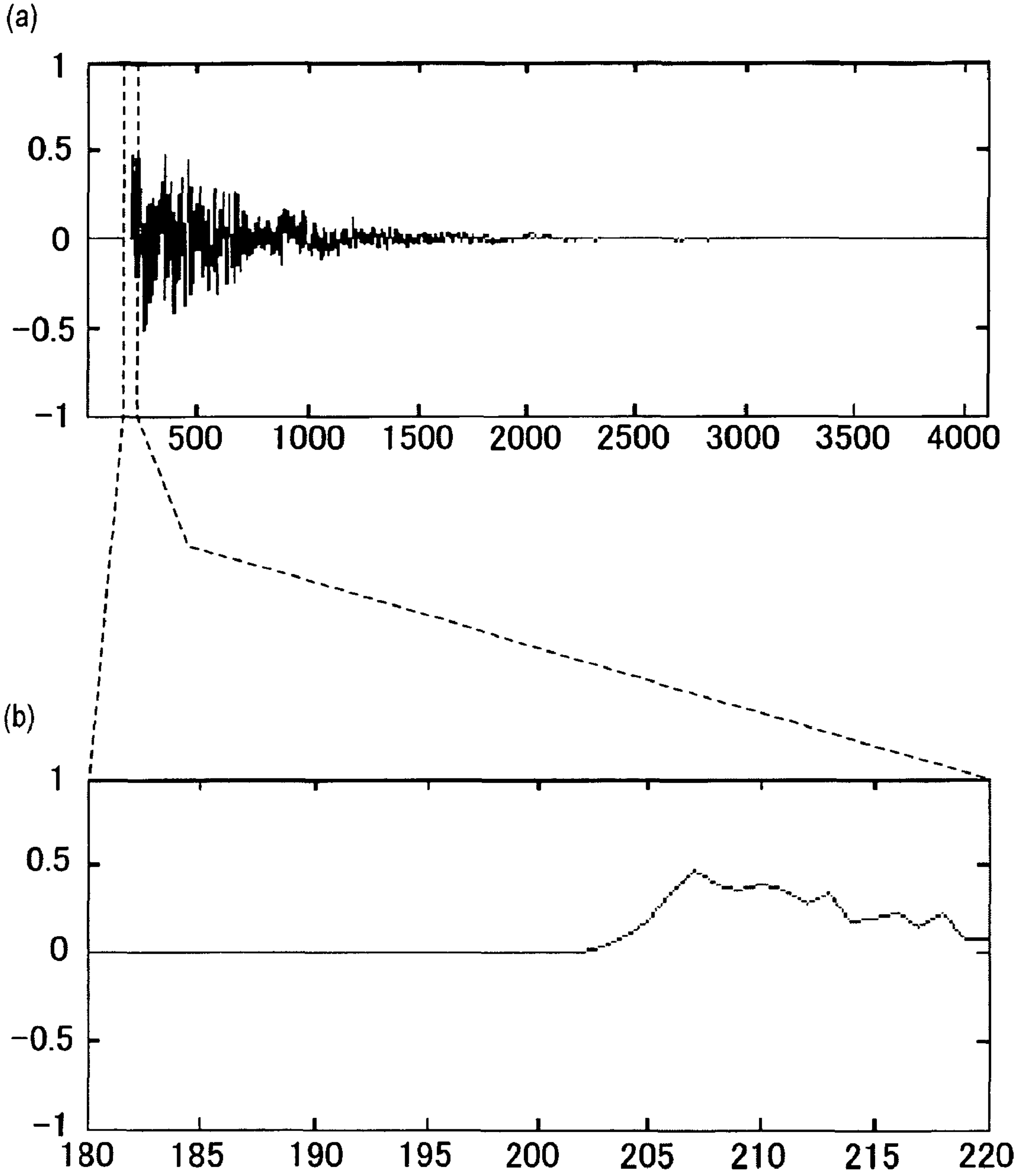
FIG. 4 is a waveform diagram showing the original waveform of an impulse response to be input to the measurement unit.

The original waveform of the impulse response, which is sampling waveform data, is indicated by (a) in FIG. 4. In FIG. 4, the x-axis indicates the number of samples, and the y-axis indicates the amplitude level. The original waveform of the impulse response, indicated by (a) in FIG. 4, is obtained by sampling using 4096 samples. The number of samples, i.e., 4096, is given by 2 to the 12th power, which is set because the number of samples suitable for, for example, FFT-based frequency analysis is a power of 2. The sampling frequency fs is 48 kHz.

The sampling timing of the impulse response is determined so that the sampling start time, or the time at sample point 0, coincides with the time at which the measurement sound processor 105 starts to output the impulse signal. Thus, the sampling timing of the impulse response (or the sound signal collected by the microphone 25) coincides with the time at which the loudspeaker 14 starts to output sound.

The rising portion of the original waveform of the impulse response, indicated by (a), which is enlarged with respect to the sample point (x-axis), is indicated by (b) in FIG. 4.

The sample data of the original waveform of the impulse response shown in FIG. 4 is input to a square processor 201 shown in FIG. 3, and is also input to a frequency analysis/filter characteristic determination unit 202.

The square processor 201 calculates of the square of the amplitude value of the impulse response. As indicated by (a) in FIG. 5, the squaring operation allows the waveform data of the impulse response having inherently positive and negative amplitude values to be transformed to positive values (hereinafter, positive transform). That is, because of the square value, the negative amplitude value is transformed to a positive amplitude value. Since the inherent negative amplitude value is used as the same polarity amplitude value as the positive amplitude value, the amplitude values of the impulse response can be measured using only the positive level, described below.

Figure 5:
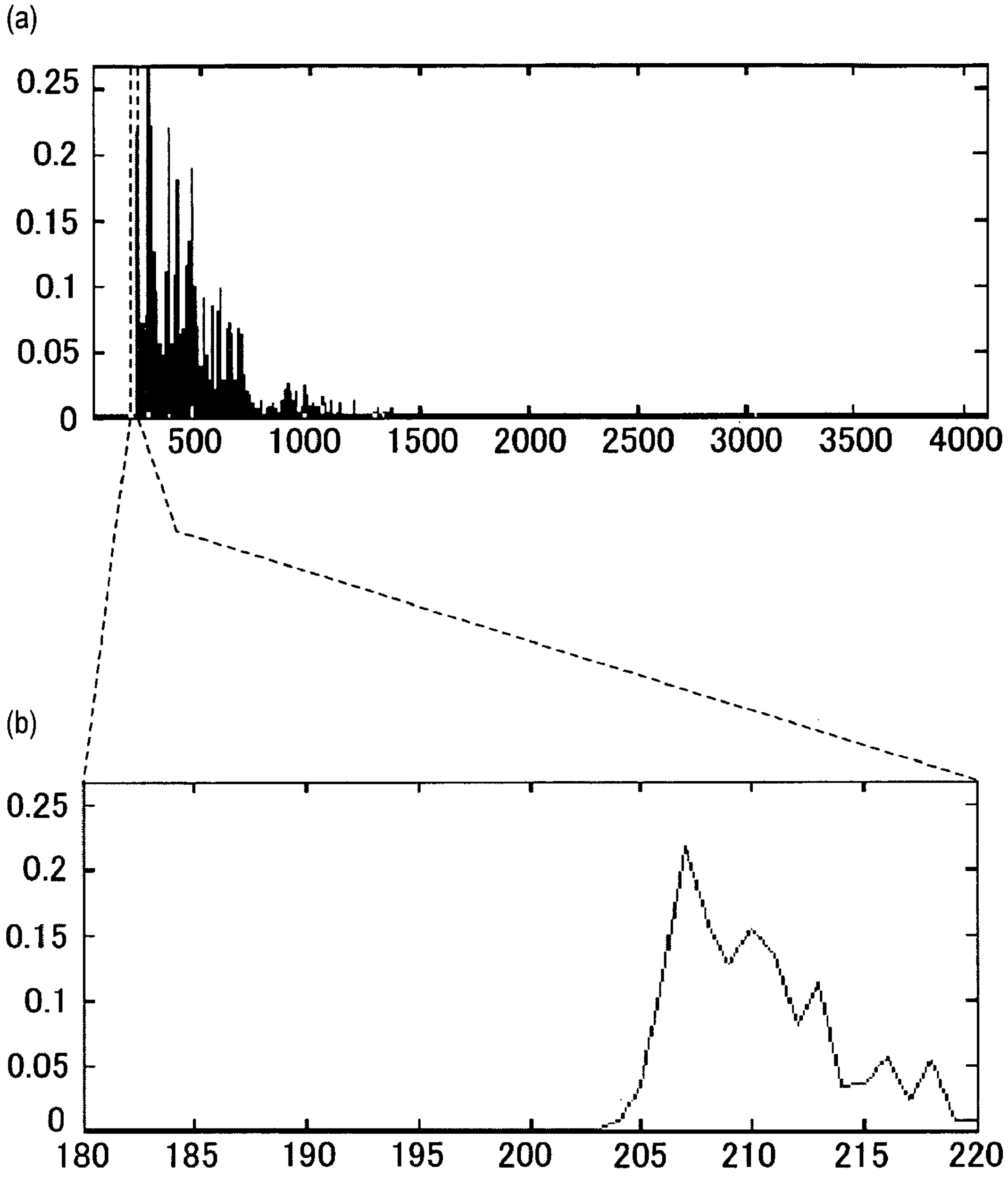
FIG. 5 is a waveform diagram obtained by squaring the impulse-response waveform shown in FIG. 4.

Comparing the waveforms indicated by (a) in FIGS. 4 and 5, the squared waveform (or the waveform of the squared impulse response) indicated by (a) in FIG. 5 exhibits a lower peak level than the original waveform because the amplitude value is the square of that in the original waveform, while the rate of change of the positive amplitude is higher than that of the original waveform indicated by (a) in FIG. 4. This can be seen by comparing the waveform indicated by (b) in FIG. 4 with a waveform indicated by (b) in FIG. 5. The waveform indicated by (b) is the rising portion of the squared waveform indicated by (a) in FIG. 5, which is enlarged with respect to the sample point (x-axis).

The sample data of the waveform of the squared impulses response is input to a variable low-pass filter 203.

The basic operation of the variable low-pass filter 203 will be described.

As described above, sample data of the squared impulse response output from the square processor 201 is input to the variable low-pass filter 203. The variable low-pass filter 203 removes unnecessary (or noise) high-frequency components from the sample data of the squared impulse response (or the squared waveform) to obtain an envelope waveform suitable for measurement.

For example, when a threshold value th is set with respect to the sample data of the squared impulse response output from the square processor 201 in the manner described below to measure the loudspeaker-microphone distance, the measured distance can include a high level of error due to the existence of high-frequency noise (that appears as vibration with large fluctuations in the waveform). Therefore, the variable low-pass filter 203 is used to attenuate the amplitude of the high-frequency components that can affect measurement of the distance. Thus, the noise resistance of the waveform for measurement can be improved, and a measurement result without error can be obtained.

However, if the variable low-pass filter 203 has filter characteristics (that is, a low-frequency transmission characteristic and a high-frequency attenuation characteristic) capable of removing too many high-frequency components, the overall envelope waveform including the rising portion of the impulse response is smoothed, and therefore, the measured distance may contain an error. Moreover, the frequency band characteristics of the waveforms of impulse responses to an identical impulse signal differ depending upon, for example, the condition of a system including the AV system and the space. Thus, the amplitudes high-frequency components differ.

Thus, preferably, the squared impulse response is low-pass filtered by changing the filter characteristic for use in low-pass filtering depending upon the frequency characteristic of the impulse response. This results in an appropriate frequency characteristic (high-frequency attenuation) of the envelope waveform irrespective of the difference in frequency characteristics of impulse responses, thereby constantly obtaining a desired measurement result.

The variable low-pass filter 203 has filter characteristics variable under the control of the frequency analysis/filter characteristic determination unit 202.

The variable low-pass filter 203 is a typical digital filter using a known moving average (MA) algorithm. In the MA algorithm, the filter characteristics change as the number of samples in the moving average, i.e., the order of the moving average, changes. That is, the larger the order of the moving average, the more the original waveform is smoothed. In other words, the high-frequency attenuation effect becomes too large.

In the present embodiment, the filter characteristics of the variable low-pass filter 203 can be changed by changing the order of the moving average.

The frequency analysis/filter characteristic determination unit 202 first performs, for example, FFT-based frequency analysis on the input sample data of the original waveform of the impulse response (or transforms the input sample data to the frequency domain). Based on the frequency characteristic (frequency response) obtained by this frequency analysis, the balance of the amplitude values in the middle frequency band and the high frequency band is checked for, and the filter characteristics of the variable low-pass filter 203 are determined according to the balance. A specific procedure for determining the filter characteristics of the variable low-pass filter 203 based on the frequency characteristic of the original waveform of the impulse response will be described.

The sample format of the original waveform of the impulse response, as defined above, is used. That is, the sampling frequency fs is 48 kHz, and the number of samples smpl is 4096. The amplitude value of the original waveform of the impulse response, obtained by FFT, is expressed in decibels (dB). With Fs=48 kHz and smpl=4096, the lowest frequency component at which the original waveform of the impulse response can be observed by FFT is given by Fs/smpl=48000/4096≈11.7 Hz. The frequency range of the original waveform of the impulse response includes frequencies F0 (=0 Hz), F1 (=11.7 Hz), . . . , F2048 (=24 kHz), from the lowest frequency. The dB values of the frequencies F0 to F2048 are set as V0 to V2048.

The frequency bands of the impulse response are defined so that the middle-frequency band ranges from 1 kHz to 4 kHz and the high-frequency band ranges from 8 kHz to 16 kHz. The frequencies F85 to F340 are assigned to the frequency range of 1 kHz to 4 kHz, and the frequencies F680 to F1366 are assigned to the frequency range of 8 kHz to 16 kHz.

Then, the balance between the amplitude value of the middle-frequency band and the amplitude value of the high-frequency band is determined.

The average dB value (mid_db) in the middle-frequency band of the original waveform of the impulse response is given by the following equation:

$$\text{mid\_db} = 1/\log 10(F341/F85) \times \sum_{n=85}^{340} \log 10(Fn + 1/Fn) \times Vn \qquad \text{Eq. (1)}$$

The average dB value (high_db) in the high-frequency band of the original waveform of the impulse response is given by the following equation:

$$\text{high\_db} = 1/\log 10(F1367/F680) \times \sum_{n=680}^{1366} \log 10(Fn + 1/Fn) \times Vn \qquad \text{Eq. (2)}$$

The frequency analysis/filter characteristic determination unit 202 compares the middle-frequency average dB value (mid_db) with the high-frequency average dB value (high_db), and determines whether or not the following relation is satisfied: mid_db−high_db<5 dB. That is, it is determined whether or not the difference between the middle-frequency average dB value (mid_db) and the high-frequency average dB value (high_db) is smaller than 5 dB. In view of the balance between the amplitude value in the middle-frequency band and the amplitude value in the high-frequency band, it is determined whether or not the amplitude value in the high-frequency band is smaller than the amplitude value in the middle-frequency band, wherein the threshold value is 5 dB. If the amplitude value in the high-frequency band of the original waveform of the impulse response is higher than that in the middle-frequency band, this means a large amount of noise or high-frequency components are superimposed (i.e., large amplitude).

As described above, the filter characteristics of the variable low-pass filter 203 can be changed by changing the order of the moving average.

In this compromise, if it is determined that the relation mid_db−high_db<5 dB is not satisfied, the frequency analysis/filter characteristic determination unit 202 sets the order of the moving average MA to MA=2 as a filter characteristic of the variable low-pass filter 203.

If it is determined that the relation mid_db−high_db<5 dB is satisfied, the order of the moving average MA is set larger than MA=2, e.g., MA=10, as a filter characteristic of the variable low-pass filter 203.

If the high-frequency average dB value (high_db) differs from the middle-frequency average dB value (mid_db) by 5 dB or more, that is, if the level of high-frequency noise is equal to or lower than a predetermined value, the order of the moving average is set to a small value, i.e., MA=2. If the difference between the middle-frequency average dB value (mid_db) and the high-frequency average dB value (high_db) is smaller than 5 dB, and the level of high-frequency noise is higher than the predetermined value, the order of the moving average is set to a higher value, i.e., MA=10, in order to increase the higher-frequency attenuation effect. Thus, an appropriate frequency characteristic of the envelope waveform obtained by the filtering operation using the low-pass filter 203 can be realized irrespective of the difference in frequency characteristics of the original signal of the impulse response.

The frequency analysis/filter characteristic determination unit 202 outputs a control signal Sc to the variable low-pass filter 203 to set the determined order of the moving average MA in the variable low-pass filter 203. The variable low-pass filter 203 sets the order of the moving average MA=2 or MA=10 before performing the filtering operation.

Figure 6A:
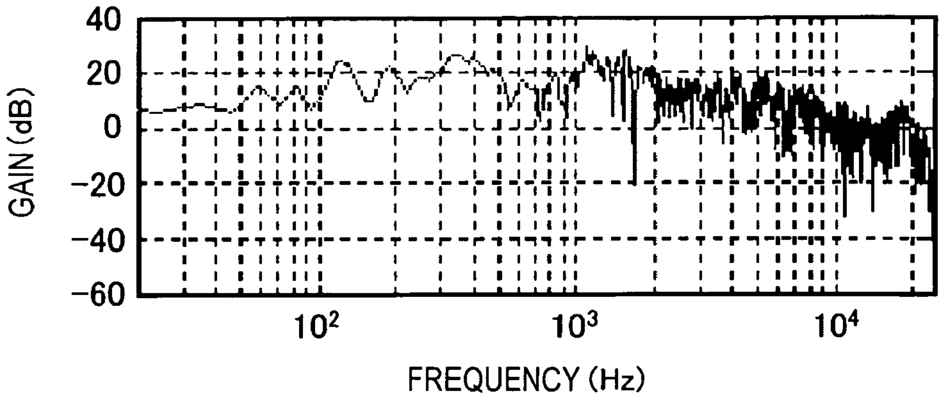
FIG. 6A is a frequency characteristic diagram for showing a process for filtering the waveform shown in FIG. 5 using a variable low-pass filter.

FIG. 6A shows the frequency characteristic of the original waveform of the impulse response shown in FIG. 4, and, for example, the frequency analysis/filter characteristic determination unit 202 determines that the frequency characteristic shown in FIG. 6A does not satisfy the relation mid_db− high_db<5 dB (that is, the high-frequency average dB value (high_db) differs from the middle-frequency average dB value (mid_db) by 5 dB or more). The frequency analysis/filter characteristic determination unit 202 sets the order of the moving average of the variable low-pass filter 203 to MA=2 based on this determination result.

Figure 6B:
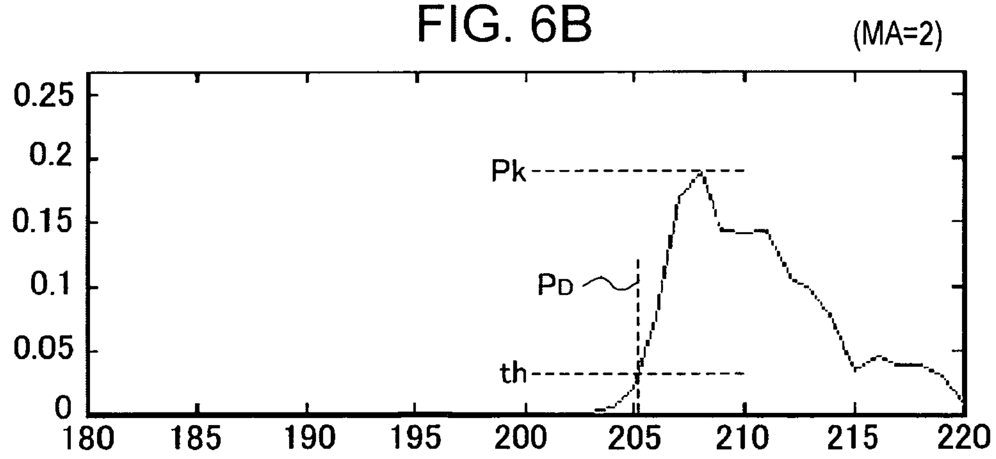
FIGS. 6B and 6C are waveform diagrams obtained by low-pass filtering.

FIG. 6B shows the waveform obtained by filtering the rising portion of the sample data of the squared impulse response, indicated by (b) in FIG. 5, using the variable low-pass filter 203 with the order of the moving average MA=2. The waveform shown in FIG. 6B is an envelope waveform in which the high-frequency components have been appropriately attenuated from the waveform indicated by (b) in FIG. 5.

The operations of the processing blocks subsequent to the variable low-pass filter 203 shown in FIG. 3 will be described in the context of the waveform shown in FIG. 6B.

The low-pass filtered waveform, or the sample data of the envelope waveform, shown in FIG. 6B, which is obtained by the filtering operation using the variable low-pass filter 203, is input to a delay-sample-number determination unit 204 and a threshold setting processor 205 shown in FIG. 3.

The threshold setting processor 205 determines a peak level Pk from the 4096-sample data of the low-pass filtered waveform shown in FIG. 6B. The amplitude level determined by a predetermined ratio with respect to the peak level Pk is set as a threshold value th. The threshold setting processor 205 transmits the threshold value th to the delay-sample-number determination unit 204.

As shown in FIG. 6B, the delay-sample-number determination unit 204 compares the amplitude value of the sample data of the low-pass filtered waveform from the variable low-pass filter 203 with the threshold value th to detect (determine) a sample point at which the low-pass filtered waveform is first equal to or higher than the threshold value th, starting from sample point 0. In FIG. 6B, the detected sample point is indicated by a delay sample point PD. The delay sample point PD represents the time delay, in terms of the number of samples, for a period of time from the sample point 0 (corresponding to the sound output start time of an impulse signal from a loudspeaker) to the rise time of the impulse response.

The delay sample point PD shown in FIG. 6B is a point detected with high accuracy without error because the filter characteristics of the variable low-pass filter 203 are appropriately determined under the control of the frequency analysis/filter characteristic determination unit 202.

Figure 6C:
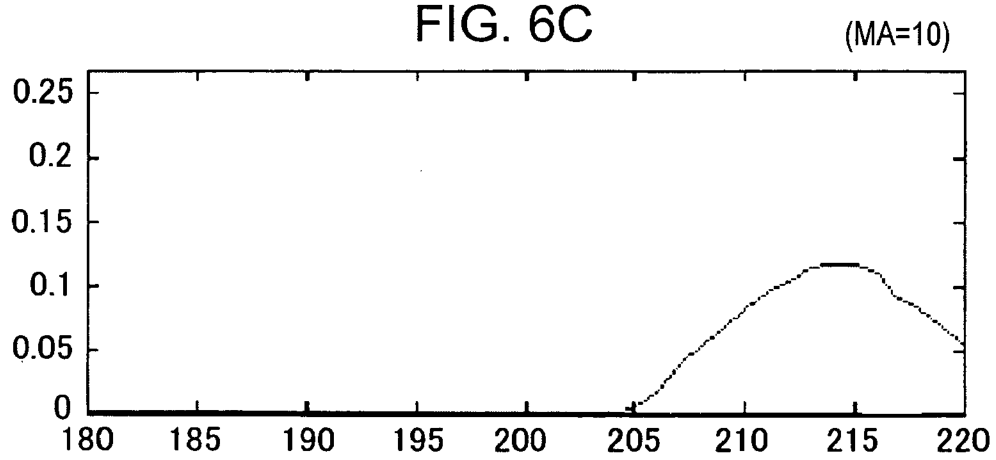

For convenience of comparison, the waveform obtained by filtering the squared waveform (FIG. 5) of the original waveform of the impulse response (FIG. 4) having the frequency characteristic shown in FIG. 6A using the variable low-pass filter 203 with the order of the moving average MA=10 is shown in FIG. 6C.

As can be seen by comparing the waveforms shown in FIGS. 6B and 6C, the envelope waveform shown in FIG. 6C, which is a low-pass filtered waveform, is excessively smoothed and less desirable than that shown in FIG. 6B. If the waveform shown in FIG. 6C is processed by the delay-sample-number determination unit 204 and the threshold setting processor 205 to detect a delay sample point PD, the detected delay sample point PD contains an error.

The information about the delay sample point PD determined by the delay-sample-number determination unit 204 is transmitted to a spatial-delay-sample-number determination unit 206.

As described above, the delay sample point PD represents the time delay, in terms of the number of samples, for a period of time from the sound output start time of an impulse signal from a loudspeaker to the rise time of the impulse response obtained by collecting sound of the impulse signal using a microphone. Conceptually, this is the time representation of the loudspeaker-microphone distance.

However, actually, system delays including a filter delay and a processing delay caused by analog-to-digital or digital-to-analog conversion occur, for example, between the signal output system for outputting an impulse signal from a loudspeaker and the signal input system for collecting the sound output from the loudspeaker using a microphone and sampling the collected sound to obtain sample data of the original waveform of the impulse response. The delay sample point PD determined by the delay-sample-number determination unit 204 actually contains an error due to such system delays or the like.

The spatial-delay-sample-number determination unit 206 cancels (subtracts) the error caused by system delays or the like from the delay sample point PD to obtain the number of true delay samples (or spatial delay samples) corresponding to the actual spatial distance between the loudspeaker and the microphone (or the listening position). The information about the number of spatial delay samples obtained by the spatial-delay-sample-number determination unit 206 is transmitted to a distance determination unit 207.

The distance determination unit 207 converts the determined number of spatial delay samples into, for example, time. Then, the distance determination unit 207 determines the loudspeaker-microphone distance by calculation using the information about the number of spatial delay samples converted into time and a sound speed value.

The loudspeaker-microphone distance information is associated with the audio channel corresponding to the loudspeaker used for measurement, and is written to a non-volatile memory region of the controller 23 for storage.

With respect to an impulse response having a larger high-frequency amplitude than the original waveform of the impulse response shown in FIG. 4, the operation to determine the loudspeaker-microphone distance information with the configuration of the measurement unit 104 shown in FIG. 3 will be described with reference to FIGS. 7 to 9C.

Figure 7:
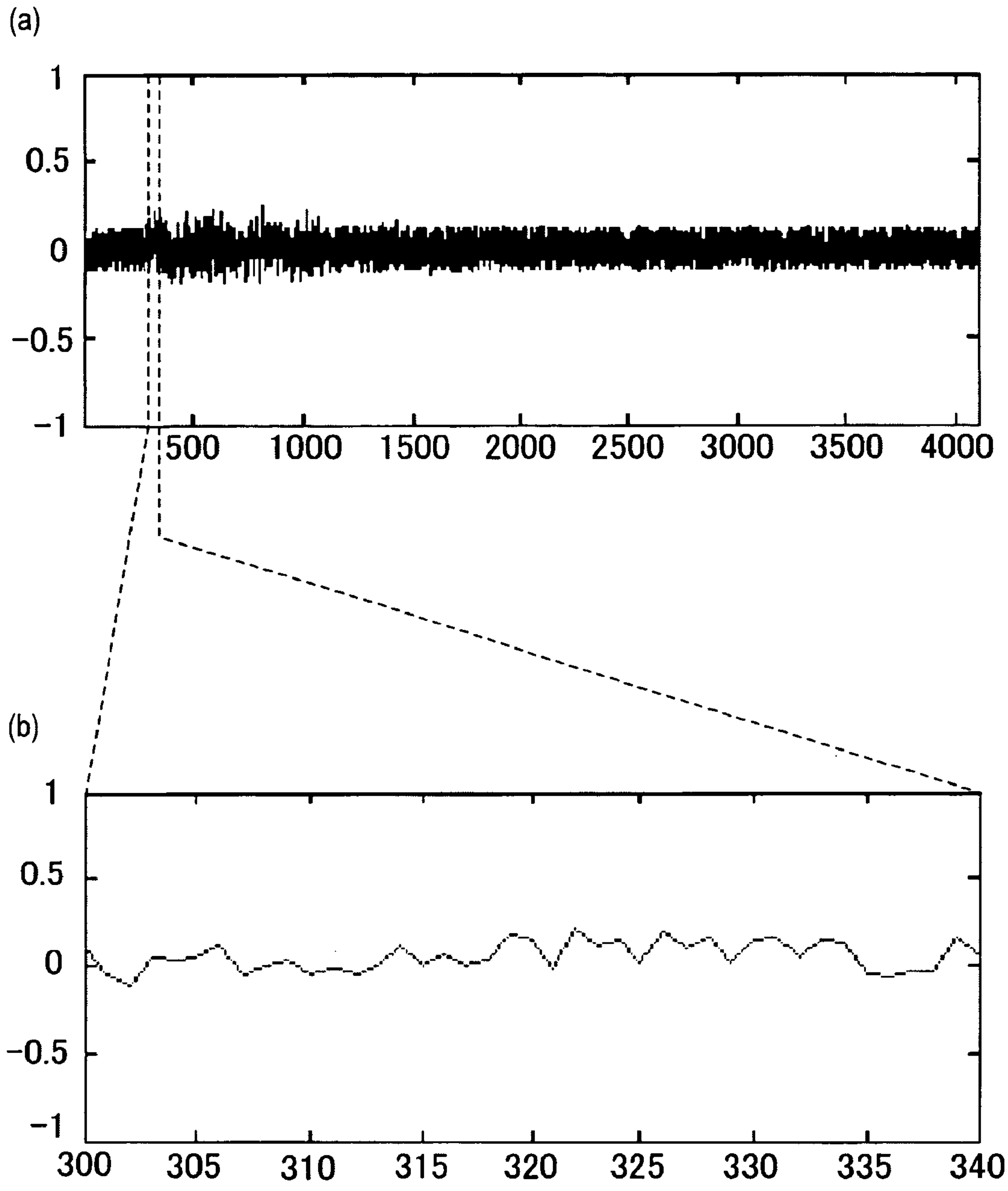
FIG. 7 is a waveform diagram showing the original waveform of another impulse response to be input to the measurement unit.

FIG. 7 shows the original waveform of an impulse response input to the measurement unit 104 shown in FIG. 3. In FIG. 7, the original waveform of the impulse response with 4096 samples is indicated by (a), and a sample point portion including the actual rising waveform of the original waveform of the impulse response, indicated by (a), which is enlarged with respect to the sample point (x-axis), is indicated by (b).

As can be seen by comparing the waveforms indicated by (a) and (b) in FIG. 4 with the waveforms indicated by (a) and (b) in FIG. 7, the original waveform of the impulse response shown in FIG. 7 has a larger high-frequency amplitude than the waveform shown in FIG. 4.

Figure 8:
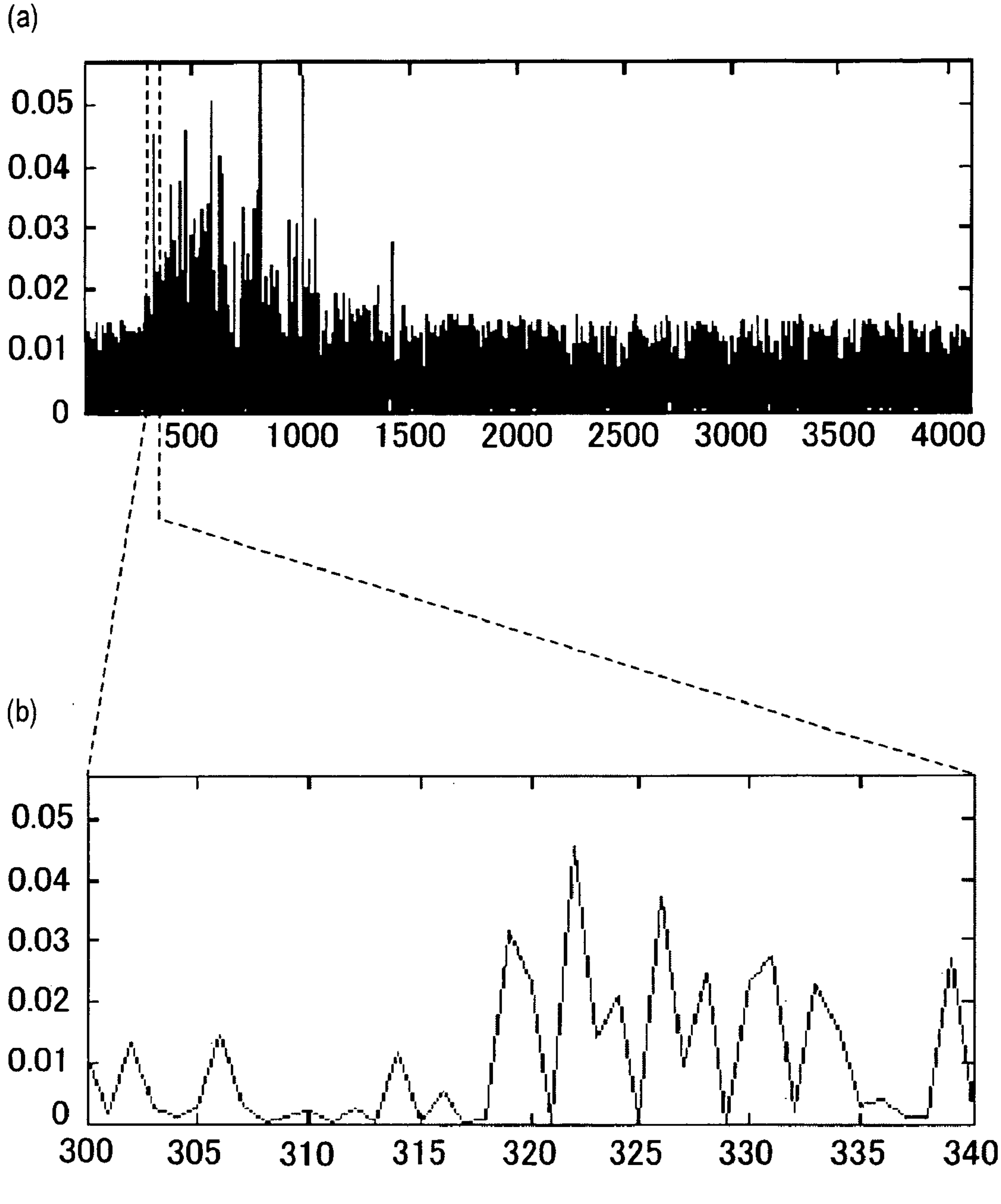
FIG. 8 is a waveform diagram obtained by squaring the impulse-response waveform shown in FIG. 7.

The original waveform of the impulse response shown in FIG. 7 is converted into a squared waveform by the square processor 201, as shown in FIG. 8. As indicated by (a) and (b) in FIG. 8, the amplitude values are transformed to positive values because of the square value. As can be seen by comparing the waveform indicated by (a) and (b) in FIG. 7 with the waveform indicated by (a) and (b) in FIG. 8, the squared waveform fluctuates with the amplitude fluctuation being emphasized.

Figure 9A:
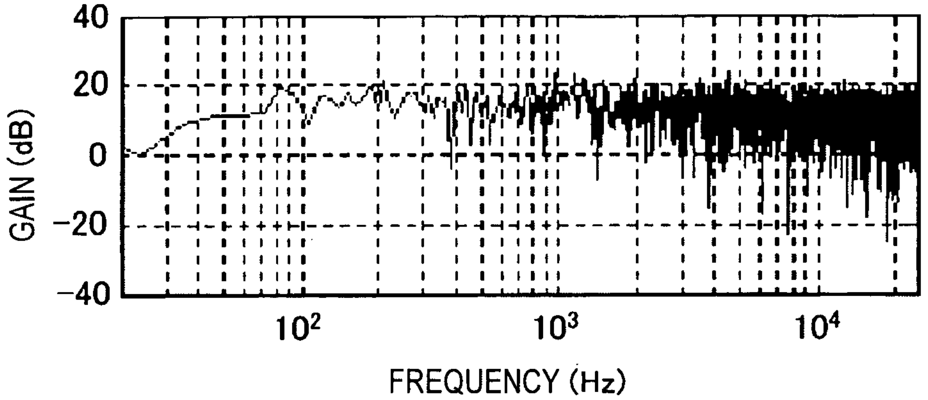
FIG. 9A is a frequency characteristic diagram for showing a process for filtering the waveform shown in FIG. 8 using the variable low-pass filter.

FIG. 9A shows the frequency characteristic of the original waveform of the impulse response shown in FIG. 7, which is obtained by frequency analysis using the frequency analysis/filter characteristic determination unit 202. The frequency characteristic shown in FIG. 9A exhibits larger amplitude fluctuations in the high-frequency region and contains more high-frequency (noise) components than that shown in FIG. 6A.

The frequency analysis/filter characteristic determination unit 202 determines that the frequency characteristic shown in FIG. 9A satisfies the relation mid_db–high_db<5 dB, and sets the order of the moving average of the variable low-pass filter 203 to MA=10 based on this determination result.

Figure 9B:
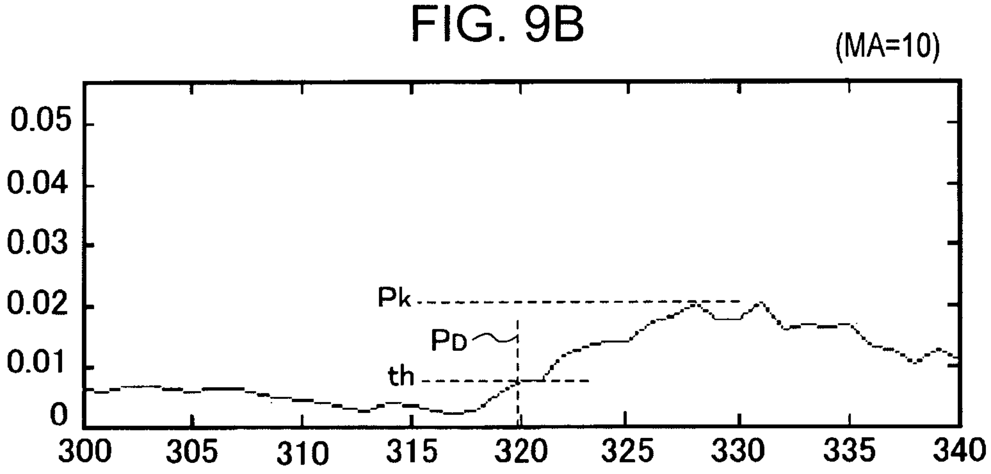
FIGS. 9B and 9C are waveform diagrams obtained by low-pass filtering.

FIG. 9B shows the low-pass filtered waveform obtained by filtering the waveform of the squared impulse response (or the squared waveform) shown in FIG. 8 using the variable low-pass filter 203 with the order of the moving average MA=10. The waveform shown in FIG. 9B exhibits an envelop with the frequency band characteristic suitable for high-accuracy measurement (detection) because a filter characteristic with the order of the moving average MA=10 is set with respect to the original waveform of the impulse response having many high-frequency components so as to increase the high-frequency attenuation effect.

The low-pass filtered waveform shown in FIG. 9B is also input to the delay-sample-number determination unit 204 and the threshold setting processor. 205, and the delay-sample-number determination unit 204 determines a delay sample point PD by comparing the amplitude value of the low-pass filtered waveform and a threshold value th. The threshold value th is also determined by the threshold setting processor 205 using a predetermined ratio with respect to a peak level Pk of the low-pass filtered waveform.

Based on the delay sample point PD, the spatial-delay-sample-number determination unit 206 and the distance determination unit 207 subsequent to the delay-sample-number determination unit 204 perform the individual operations to obtain the loudspeaker-microphone distance information.

Figure 9C:
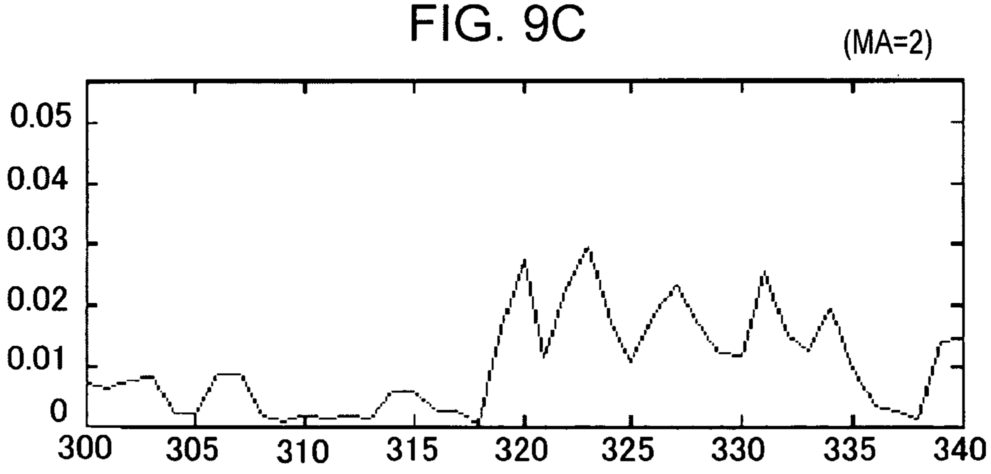

FIG. 9C shows the low-pass filtered waveform obtained by filtering the waveform of the squared impulse response (see FIG. 8) of the original waveform of the impulse response (see FIG. 7) having the frequency characteristic shown in FIG. 9A using the variable low-pass filter 203 with the order of the moving average MA=2.

The envelope of the low-pass filtered waveform shown in FIG. 9C exhibits that more unnecessary high-frequency components remains than that shown in FIG. 9B. If the waveform shown in FIG. 9C is processed by the delay-sample-number determination unit 204 and the threshold setting processor 205 to detect a delay sample point PD, the detected delay sample point PD contains an error.

The process for obtaining the loudspeaker-microphone distance information is performed with respect to all loudspeakers to finally obtain the loudspeaker-microphone distance information between all audio channels of loudspeakers in the AV system 1 and the microphone 25. The loudspeaker-microphone distance information is stored in the controller 23.

The controller 23 determines the time difference of sounds reaching in space from the individual audio channels of loudspeakers to the listening position (in the measurement mode, for example, the position of the microphone 25) based on the difference in distance between the individual audio channels of loudspeakers to the microphone 25. Based on the time difference, the controller 23 sets a delay time of the delay processor 111 with respect to each audio channel in order to compensate for the time difference of sounds reaching from the audio channels of loudspeakers to the listening position. The delay processor 111 delays individual audio channels of audio signals by the respective delay times. Therefore, a better sound field that has been compensated for variations in the arrival time of sound due to the difference in distance between the individual loudspeakers and the listening position can be produced at a listening position. That is, sound field correction, called time alignment, is performed.

Figure 10:
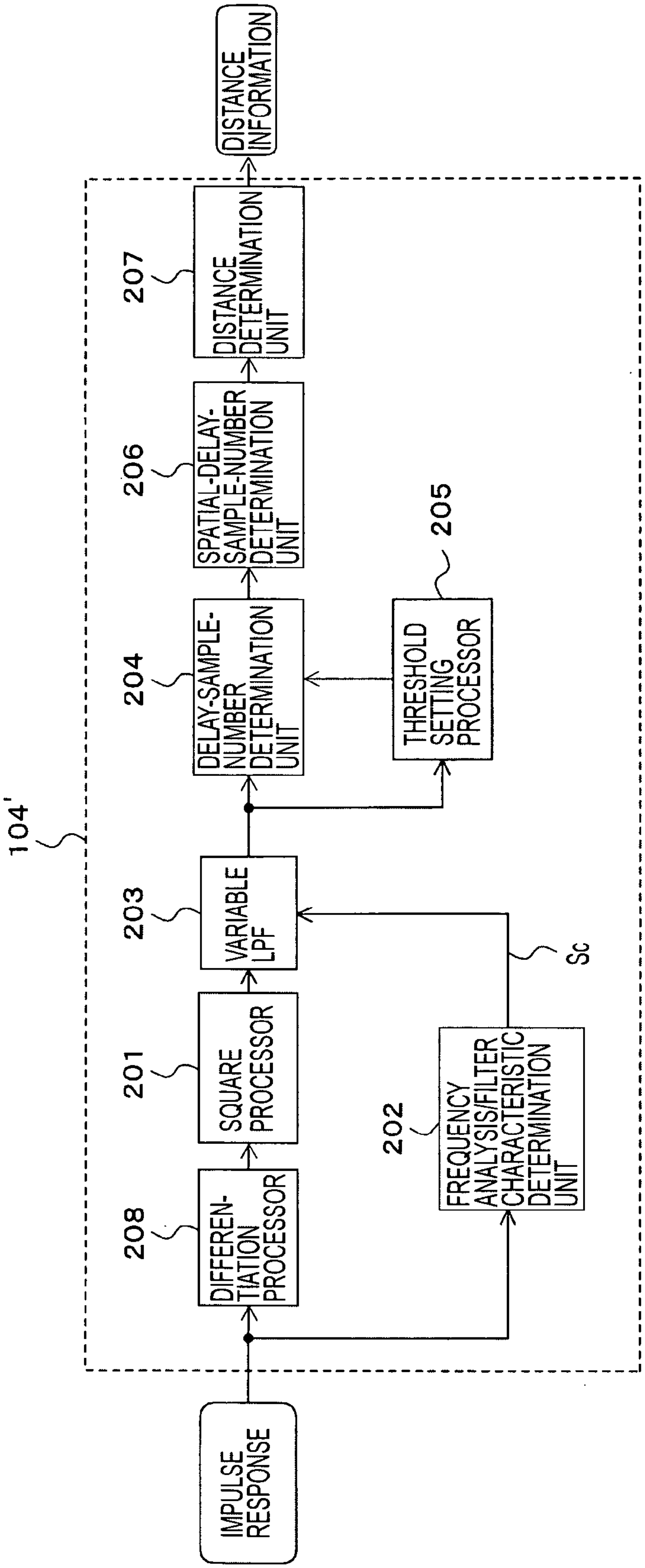
FIG. 10 is a block diagram of another measurement unit in the acoustic correction apparatus for measuring the spatial loudspeaker-microphone distance.

FIG. 10 shows the structure of a measurement unit 104' according to a modification of the present embodiment of the present invention. In FIG. 10, the same parts as those shown in FIG. 3 are assigned the same reference numerals, and a description thereof is omitted.

The measurement unit 104' further includes a differentiation processor 208 prior to the square processor 201. An impulse response to be input to the differentiation processor 208 is also input to the frequency analysis/filter characteristic determination unit 202. That is, the original waveform of the impulse response is input to the frequency analysis/filter characteristic determination unit 202.

The operation of the measurement unit 104' shown in FIG. 10 will be described with reference to FIGS. 11 to 13B.

Figure 11:
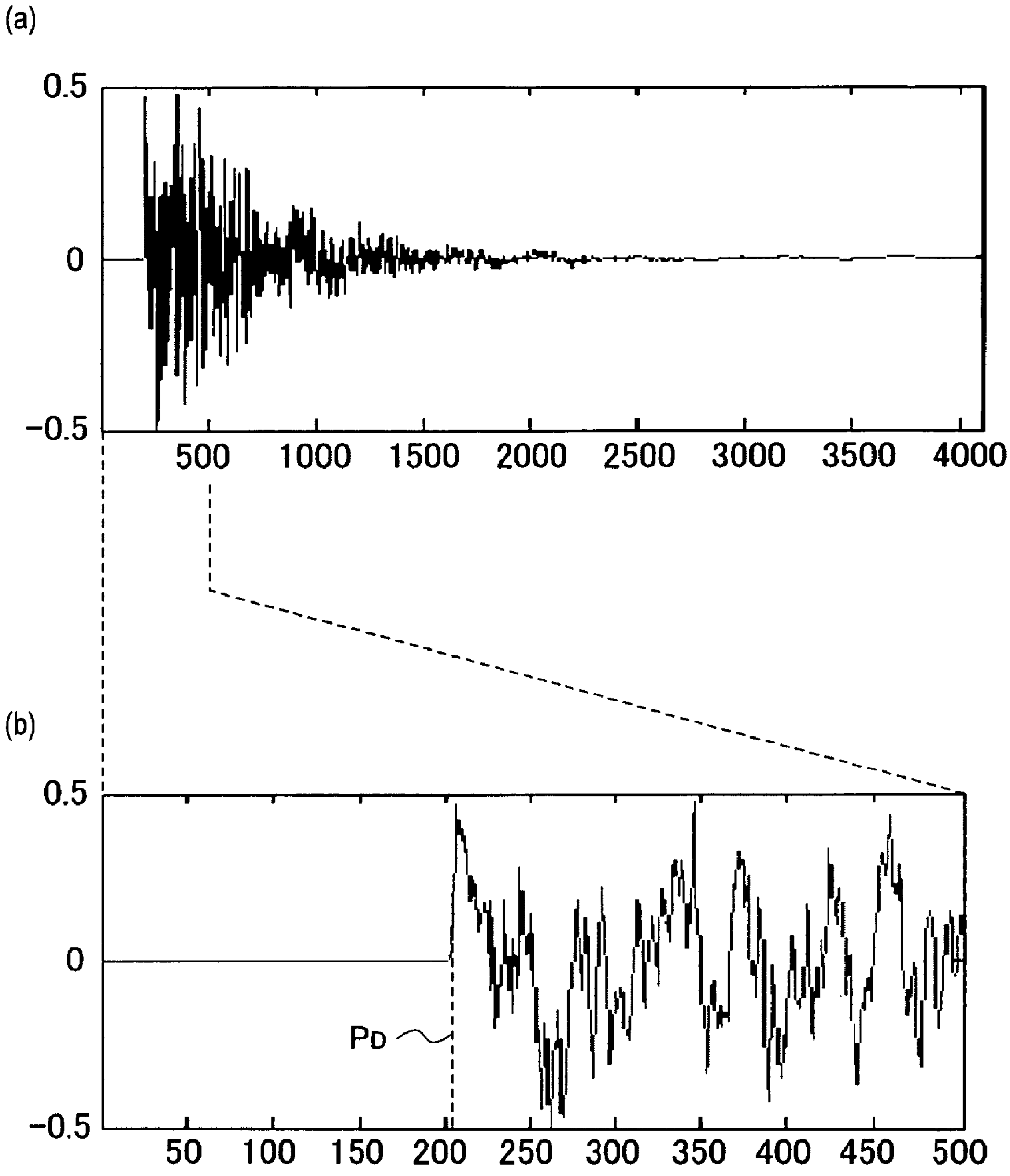
FIG. 11 is a waveform diagram showing the original waveform of an impulse response to be input to the measurement unit shown in FIG. 10.

FIG. 11 shows the original waveform of the impulse response input to the differentiation processor 208 and the frequency analysis/filter characteristic determination unit 202. In FIG. 11, the original waveform of the impulse response with 4096 samples is indicated by (a), and a sample point portion including the actual rising waveform of the original waveform of the impulse response, indicated by (a), which is enlarged with respect to the sample point (x-axis), is indicated by (b).

In the measurement unit 104', first, the original waveform of the impulse response shown in FIG. 11 is differentiated by the differentiation processor 208.*to* obtain, for example, the time difference in amplitude levels of the original waveform of the impulse response.

Figure 12A:
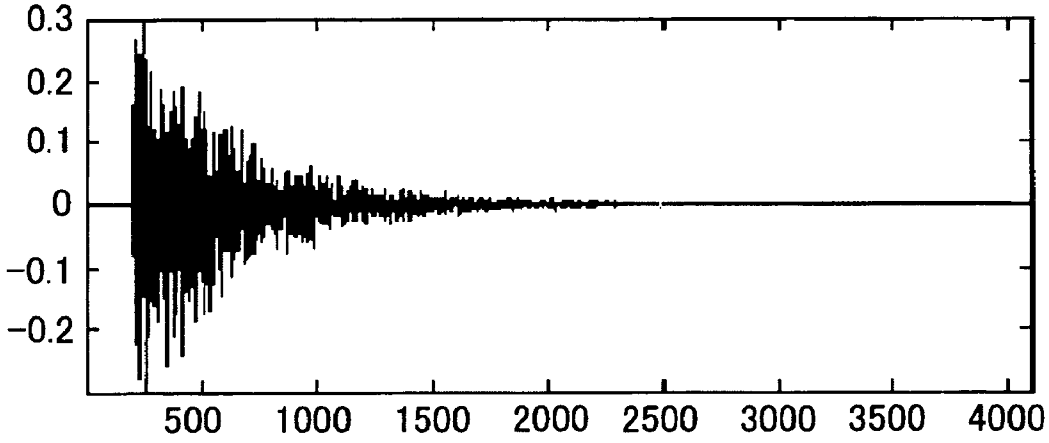
FIGS. 12A and 12B are waveform diagrams obtained by differentiating and squaring the waveform of the impulse response shown in FIG. 11, respectively.

With differentiation, the original waveform of the impulse response, indicated by (a) in FIG. 11, is converted into a differentiated waveform shown in FIG. 12A.

The differentiated waveform shown in FIG. 12A exhibits more emphasized amplitude fluctuations than the original waveform of the impulse response indicated by (a) in FIG. 11. The differentiated waveform shown in FIG. 12A exhibits enlarged amplitude fluctuations in the rising portion of the low-pass filtered waveform (or envelope waveform) finally obtained by the variable low-pass filter 203. In this case, the inherent amplitude hidden in the high-frequency components is emphasized, and therefore high noise resistance is also realized. Thus, the delay sample point PD can be detected with higher accuracy.

In the present modification, the square processor 201 performs a squaring operation on the differentiated waveform to produce the waveform of the squared impulse response. The squaring operation allows the waveform shown in FIG. 12A to be converted into the waveform of the squared impulse response (or the squared waveform) shown in FIG. 12B.

Figure 13A:
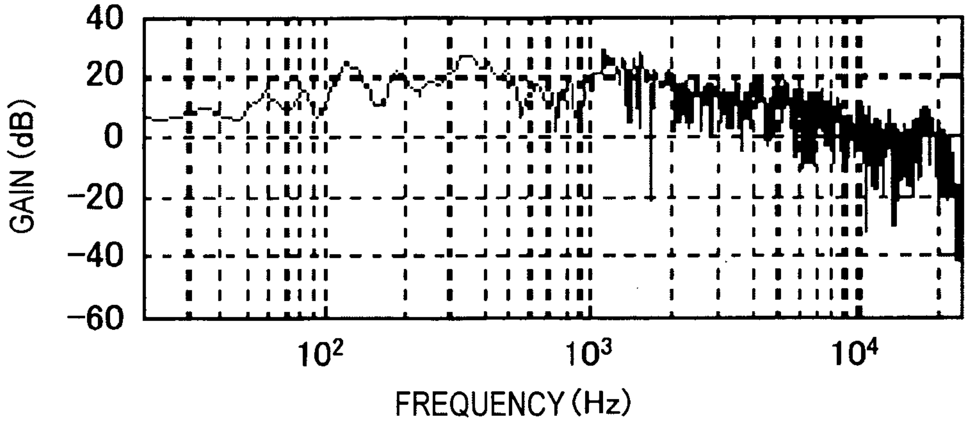
FIG. 13A is a frequency characteristic diagram for showing a process for filtering the waveform shown in FIG. 12B using the variable low-pass filter.

Likewise, the frequency analysis/filter characteristic determination unit 202 performs, for example, FFT-based frequency analysis on the original waveform of the impulse response to determine the frequency characteristic of the original waveform of the impulse response. FIG. 13A shows the frequency characteristic of the original waveform of the impulse response.

The frequency analysis/filter characteristic determination unit 202 determines that the frequency characteristic shown in FIG. 13A satisfies the relation mid_db_high_db<5 dB. As described above, based on this determination result, the frequency analysis/filter characteristic determination unit 202 sets the order of the moving average of the variable low-pass filter 203 to MA=2.

Figure 13B:
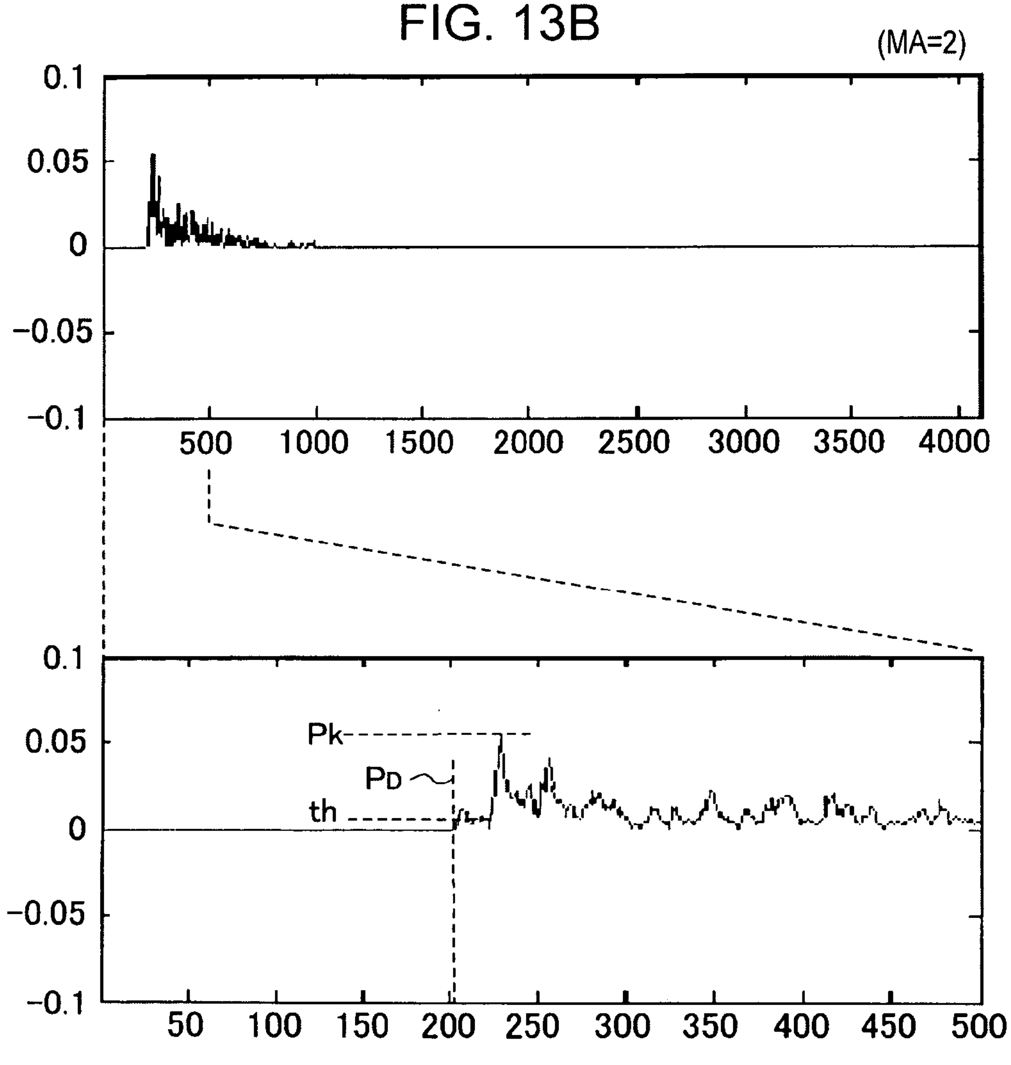
FIG. 13B is a waveform diagram obtained by low-pass filtering.

FIG. 13B shows a low-pass filtered waveform that is the waveform of the squared impulse response transmitting the variable low-pass filter 203 with the order of the moving average MA=2.

Figure 12B:
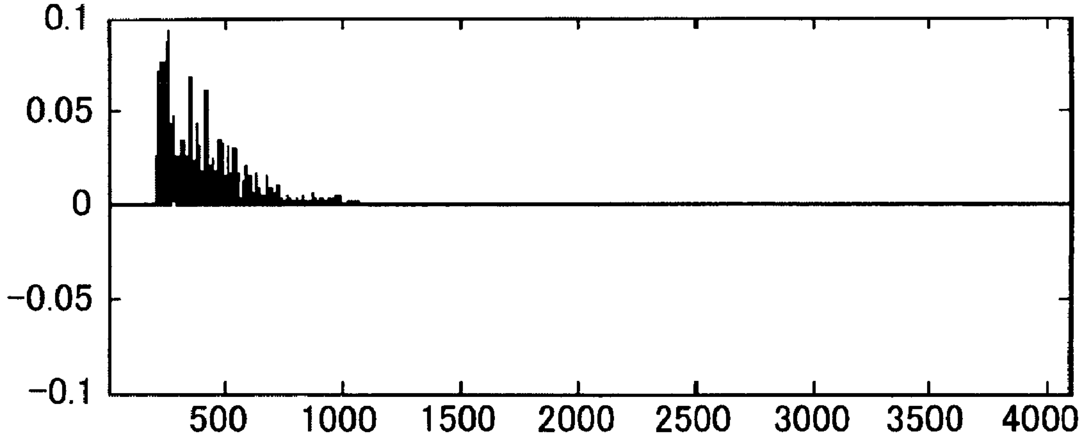

The low-pass filtered waveform shown in FIG. 13B is obtained by removing the high-frequency components from the waveform of the squared impulse response (or the squared waveform) shown in FIG. 12B by the amount of high-frequency attenuation corresponding to the order of the moving average MA=2. That is, an envelope waveform of the waveform of the squared impulse response shown in FIG. 12B is obtained.

Likewise, the low-pass filtered waveform shown in FIG. 12B is input to the delay-sample-number determination unit 204 and the threshold setting processor 205. As described above, the threshold setting processor 205 determines a threshold value th from a peak level Pk of the input low-pass filtered waveform, and transmits the threshold value th to the delay-sample-number determination unit 204.

The delay-sample-number determination unit 204 compares the amplitude level of the input low-pass filtered waveform with the threshold value th to determine a delay sample point PD, as indicated by the enlarged portion of the waveform shown in FIG. 13B.

Based on the delay sample point PD, the spatial-delay-sample-number determination unit 206 and the distance determination unit 207 subsequent to the delay-sample-number determination unit 204 perform the operations similar to those described above to correctly obtain the loudspeaker-microphone distance information.

With the addition of the differentiation processor 208 in the measurement unit 104' shown in FIG. 10, the loudspeaker-microphone distance information as a measurement result is obtained with the amplitude of the original waveform of the impulse response being emphasized. Depending upon the setting of the differentiation processor 208, the rising waveform of the impulse response may become effectively noticeable, thus allowing more reliable measurement of the loudspeaker-microphone distance.

The present invention is not limited to the embodiments described above.

The frequency analysis/filter characteristic determination unit 202 may use any algorithm other than that described in the foregoing embodiments in order to determine a filter characteristic using the frequency characteristic of the original waveform of the impulse response. Specifically, for example, the frequency ranges of the middle and high frequency bands may be modified, or the method for determining the amplitude levels of the middle and high frequency bands or the method for comparing the amplitude levels of the middle and high frequency bands may be modified, if necessary. Other than the two frequency bands, i.e., the middle and high frequency bands, more frequency bands may be used, and the amplitude levels of these frequency bands may be compared to determine a filter characteristic.

In the foregoing embodiments, the order of the moving average MA is set to two values, i.e., MA=2 and MA=10, to change the filter characteristic of the variable low-pass filter 203. The order of the moving average MA may be set to any other value.

While the filter characteristic may be modified in two stages, more stages may be used to change the filter characteristics.

The filter characteristic of the variable low-pass filter 203 may also be modified by changing parameters other than the moving average, e.g., the cutoff frequency. Thus, the variable low-pass filter 203 may use any algorithm other than the moving average algorithm.

In the foregoing embodiments, the spatial distance between a loudspeaker and a microphone (or a listening position) is determined using an impulse-response-based measurement item. In the foregoing embodiments, the spatial loudspeaker-microphone distance corresponds to a period of time from when the sound radiated (or output) from a loudspeaker until the sound reaches a microphone (or a listening position). Thus, a period of time from when the sound radiated (or output) from a loudspeaker until the sound reaches a microphone (or a listening position) may be determined as a measurement item, instead of the spatial loudspeaker-microphone distance because the spatial distance and the period of time are equivalent.

In the foregoing embodiments, an impulse response is squared in order to perform positive transform. As long as the impulse response can be transformed into positive values, any positive transform operation other than the squaring operation may be used.

Instead of the squaring operation, for example, a negative amplitude value may simply be transformed to a positive value. The square root of the amplitude value of the waveform of the impulse response may be calculated.

When measurement is performed using the waveform of an impulse response that has been subjected to at least a positive transform process and a low-pass filtering process using a filter characteristic adaptive to the frequency characteristic of the impulse-response waveform after the positive transform process, the measurement item is not limited to the spatial distance between a loudspeaker and a microphone (or a listening position). A measurement result may also be used for application other than sound field correction based on time alignment.

In the acoustic correction apparatus 2, the sound field correction block 110 includes the delay processor 111, the equalizer 112, and the gain adjuster 113, and the delay processor 111 performs sound field correction based on time alignment. According to an embodiment of the present invention, the equalizer 112 and the gain adjuster 113 may be set based on a measurement result so that the quality of the sound output from each loudspeaker and the gain (level) can be compensated for to correct a sound field. Moreover, application other than acoustic measurement for correcting a sound field may be conceived; for example, room reverberant sound may be measured.

According to an embodiment of the present invention, the process performed by the measurement unit 104 or 104' shown in FIG. 3 or 10 and the processes performed by the functional block forming the sound field correction and measurement function unit 22 shown in FIG. 2 may be implemented by software to be executed by the controller 23 serving as a microcomputer according to a program stored in, for example, an internal ROM.

While the acoustic correction apparatus 2 according to the foregoing embodiment is attachable kit, an acoustic correction apparatus according to an embodiment of the present invention may be incorporated into an AV system.

The signal processing performed by a measuring apparatus according to an embodiment of the present invention may be implemented by software to be executed by a DSP or a CPU. For example, a TSP measurement signal may be output from a standard audio output terminal of a personal computer, and may be supplied to the power amplifier 13 to drive the loudspeaker 14. The microphone 25 may be connected to a microphone input terminal, and the measurement process described above may be performed by the CPU in the personal computer. The measurement process offered in form of software (program) executable on the personal computer allows a listener to achieve the sound correction and measurement functions.

It should be understood by those skilled in the art that various modifications, combinations, sub-combinations and alterations may occur depending on design requirements and other factors insofar as they are within the scope of the appended claims or the equivalents thereof.

What is claimed is:

1. A measuring apparatus for use in an audio reproduction system having a loudspeaker, said apparatus comprising:

impulse response obtaining means for obtaining an impulse response signal;

positive transform means for performing a positive transform on the impulse response signal obtained by the impulse response obtaining means;

low-pass filter means for filtering the impulse response signal on which the positive transform was performed by the positive transform means;

frequency characteristic obtaining means for obtaining a frequency characteristic of the impulse response signal obtained by the impulse response obtaining means;

filter characteristic setting means for setting a filter characteristic of the low-pass filter means so as to be variable depending upon the frequency characteristic obtained by the frequency characteristic obtaining means; and measurement result obtaining means for obtaining a measurement result about a predetermined measurement item based on a waveform of an output of the low-pass filter means, said predetermined measurement item being representative of a distance between a listening position of a user and the loudspeaker, and wherein an operation to measure the distance is based on signal processing of an impulse response to an impulse output of the loudspeaker, and wherein the predetermined measurement item is based on a comparison of a middle-frequency average dB value and a high-frequency average dB value.

2. The apparatus according claim 1, further comprising differentiating means connected before the positive transform means for differentiating the impulse response signal obtained by the impulse response obtaining means.

3. A measuring method for use in an audio reproduction system having a loudspeaker, said method comprising the steps of:

obtaining an impulse response signal;

performing a positive transform on the impulse response signal obtained in the step of obtaining an impulse response;

low-pass filtering the impulse response signal on which the positive transform was performed;

obtaining a frequency characteristic of the impulse response signal obtained in the step of obtaining an impulse response signal;

setting a filter characteristic for the step of low-pass filtering so as to be variable depending upon the frequency characteristic obtained in the step of obtaining a frequency characteristic; and obtaining a measurement result about a predetermined measurement item based on a waveform obtained in the step of low-pass filtering, said predetermined measurement item being representative of a distance between a listening position of a user and the loudspeaker, and wherein an operation to measure the distance is based on signal processing of an impulse response to an impulse output of the loudspeaker, and wherein the predetermined measurement item is based on a comparison of a middle-frequency average dB value and a high-frequency average dB value.

4. A non-transitory computer-readable medium containing a program that causes a measuring apparatus for use in an audio reproduction system having a loudspeaker to execute the steps of:

obtaining an impulse response signal;

performing a positive transform on the impulse response signal obtained in the step of obtaining an impulse response signal;

low-pass filtering the impulse response signal on which the positive transform is performed;

obtaining a frequency characteristic of the impulse response signal obtained in the step of obtaining an impulse response signal;

setting a filter characteristic for the step of low-pass filtering so as to be variable depending upon the frequency characteristic obtained in the step of obtaining a frequency characteristic; and obtaining a measurement result about a predetermined measurement item based on a waveform obtained in the step of low-pass filtering, said predetermined measurement item being representative of a distance between a listening position of a user and the loudspeaker, and wherein an operation to measure the distance is based on signal processing of an impulse response to an impulse output of the loudspeaker, and wherein the predetermined measurement item is based on a comparison of a middle-frequency average dB value and a high-frequency average dB value.

5. A measuring apparatus for use in an audio reproduction system having a loudspeaker, said apparatus comprising:

an impulse response obtaining section obtaining an impulse response signal;

a positive transform section performing a positive transform on the impulse response signal obtained by the impulse response obtaining section;

a low-pass filter filtering the impulse response signal on which positive transform was performed by the positive transform section;

a frequency characteristic obtaining section obtaining a frequency characteristic of the impulse response signal obtained by the impulse response obtaining section;

a filter characteristic setting section setting a filter characteristic of the low-pass filter so as to be variable depending upon the frequency characteristic obtained by the frequency characteristic obtaining section; and a measurement result obtaining section obtaining a measurement result about a predetermined measurement item based on a waveform output of the low-pass filter, said predetermined measurement item being representative of a distance between a listening position of a user and the loudspeaker, and wherein an operation to measure the distance is based on signal processing of an impulse response to an impulse output of the loudspeaker, and wherein the predetermined measurement item is based on a comparison of a middle-frequency average dB value and a high-frequency average dB value.

6. The apparatus according claim 1, in which the audio reproduction system further has a microphone and in which said microphone is located at the listening position of the user.

7. The apparatus according claim 1, in which the positive transform means is operable to calculate a square of an amplitude of the impulse response signal obtained by the impulse response obtaining means.

8. The apparatus according claim 5, in which the audio reproduction system further has a microphone and in which said microphone is located at the listening position of the user.

9. The apparatus according claim 5, in which the positive transform section is operable to calculate a square of an amplitude of the impulse response signal obtained by the impulse response obtaining section.

* * * * *